(12) United States Patent
Lee

(10) Patent No.: US 7,579,308 B2
(45) Date of Patent: Aug. 25, 2009

(54) COMPOSITIONS AND PROCESSES FOR PHOTORESIST STRIPPING AND RESIDUE REMOVAL IN WAFER LEVEL PACKAGING

(75) Inventor: Wai Mun Lee, Fremont, CA (US)

(73) Assignee: EKC/DuPont Electronics Technologies, Hayward, CA (US)

( * ) Notice: Subject to any disclaimer, the term of this patent is extended or adjusted under 35 U.S.C. 154(b) by 385 days.

(21) Appl. No.: 11/120,054

(22) Filed: May 2, 2005

(65) Prior Publication Data

US 2005/0263743 A1 Dec. 1, 2005

Related U.S. Application Data

(60) Continuation-in-part of application No. 10/689,657, filed on Oct. 22, 2003, now Pat. No. 7,135,445, which is a continuation-in-part of application No. 10/007,134, filed on Dec. 4, 2001, now Pat. No. 7,157,415, which is a division of application No. 09/343,532, filed on Jun. 30, 1999, now Pat. No. 6,417,112.

(60) Provisional application No. 60/623,190, filed on Oct. 29, 2004, provisional application No. 60/092,024, filed on Jul. 6, 1998.

(51) Int. Cl.
*C11D 7/50* (2006.01)
(52) U.S. Cl. ...................................... 510/175
(58) Field of Classification Search ................. 510/175, 510/176
See application file for complete search history.

(56) References Cited

U.S. PATENT DOCUMENTS

| 3,075,923 A | 1/1963 | Berst et al. |
| 3,147,224 A | 9/1964 | Gauntt et al. |
| 3,600,322 A | 8/1971 | Morison et al. |
| 3,625,763 A | 12/1971 | Melillo |
| 3,650,969 A | 3/1972 | Baltakmens et al. |
| 3,789,907 A | 2/1974 | Nakata et al. |
| 3,813,309 A | 5/1974 | Bakos et al. |
| 4,269,724 A | 5/1981 | Hodson |
| 4,278,577 A | 7/1981 | Song |
| 4,395,479 A | 7/1983 | Ward et al. |
| 4,401,747 A | 8/1983 | Ward, Jr. et al. |
| 4,403,029 A | 9/1983 | Ward, Jr. et al. |
| 4,428,871 A | 1/1984 | Ward et al. |
| 4,483,917 A | 11/1984 | Archer et al. |
| 4,592,787 A | 6/1986 | Johnson |
| 4,744,834 A | 5/1988 | Haq |
| 4,770,713 A | 9/1988 | Ward |
| 5,091,103 A | 2/1992 | Dean et al. |

(Continued)

OTHER PUBLICATIONS

Adv. Polym. Sci., 172;121-139, 2005—Hiroshi Ito et al.

(Continued)

*Primary Examiner*—Gregory E Webb
(74) *Attorney, Agent, or Firm*—Dunlap Codding, P.C.

(57) ABSTRACT

Improved compositions and processes for removing photoresists, polymers, post etch residues, and post oxygen ashing residues from interconnect, wafer level packaging, and printed circuit board substrates are disclosed. One process comprises contacting such substrates with mixtures containing an effective amount of organic ammonium compound(s); from about 2 to about 20 weight percent of oxammonium compound(s); optionally organic solvent(s); and water.

9 Claims, 26 Drawing Sheets

500 Microns Pitch         100 Microns Pitch

TODAY'S PWB               NEEDED FOR WLP

U.S. PATENT DOCUMENTS

| | | | | |
|---|---|---|---|---|
| 5,780,406 | A | * | 7/1998 | Honda et al. ............... 510/175 |
| 5,846,695 | A | | 12/1998 | Iwata et al. |
| 5,962,197 | A | | 10/1999 | Chen |
| 5,968,848 | A | * | 10/1999 | Tanabe et al. ............... 438/745 |
| 6,060,439 | A | * | 5/2000 | Doyel et al. ............... 510/164 |
| 6,191,086 | B1 | * | 2/2001 | Leon et al. ............... 510/175 |
| 6,268,323 | B1 | * | 7/2001 | Honda et al. ............... 510/176 |
| 6,417,112 | B1 | | 7/2002 | Peyne et al. |
| 6,585,825 | B1 | * | 7/2003 | Skee ............... 134/3 |
| 6,610,456 | B2 | | 8/2003 | Allen et al. |
| 6,670,095 | B2 | | 12/2003 | Sato et al. |
| 6,683,202 | B2 | | 1/2004 | Ogata et al. |
| 6,692,887 | B1 | | 2/2004 | Suwa et al. |
| 6,727,032 | B1 | | 4/2004 | Suwa et al. |
| 6,730,452 | B2 | | 5/2004 | Brock et al. |
| 6,737,215 | B2 | | 5/2004 | Dammel et al. |
| 6,749,989 | B2 | | 6/2004 | Hada et al. |
| 6,794,110 | B2 | | 9/2004 | Breyta et al. |
| 6,818,377 | B2 | | 11/2004 | Kodama et al. |
| 2002/0134963 | A1 | | 9/2002 | Peyne et al. |

OTHER PUBLICATIONS

Brakensiek et al "Wet-recess Process Optimization of a Bottom Antireflective Coating for the Via First Dual Damascene Scheme", Proc. SPIE: Adv. in Resist Tech & Proc. XII, vol. 5376 (J. Sturtevant, ed), 2004.

Neef et al "New BARC Materials for the 65-nm Node in 193-nm Lithography:", Proc. SPIE: Adv. in Resist Tech & Proc XII, 5376 (Sturtevant, ed) 2004.

Lui He et al., "Bottom Anti-Reflective Coatings (BARCs) for 157-nm Lithography", Proc. Soc. Photo Optical Instru. Eng. 2003.

J.D. Meador et al., "193-nm Multilayer Imaging Systems", Proc. Soc photo-Optical Instrm Eng, 2003.

J.D. Meador et al., "New Materials for 193-nm Trilayer Imaging", Proc. SPIE Adv. in Resist Tech & Proc XII, vol. 5376 (J Sturtevant, ed) 2004.

M. Bhave et al "Developer-soluble Gap fill Materials for Patterning Metal trenches in Via-first Dual Damascene Process", Proc. SPIE: Adv in Resist Tech. & Proc, XII vol. 5376 (J. Sturtevant, ed) 2004.

M. Weimer et al., "New Material for 193-nm Bottom Anti-Reflective Coatings", Proc. Soc. Photo-Optical Instrum. Eng. 2003.

R. Huang "Via Fill Properties of Organic BARCs in Dual Damascene Application", Proc. SPIE: Adv. in Resist Tech. & Proc XII, vol. 5376 (J. Sturtevant, ed) 2004.

K. A. Nowak, "Void Elimination Research in Bottom Anti-Reflective Coatings for Dual Damascene Lithography", Proc. Sco. Photo-Optical Instrum Eng., 2003.

* cited by examiner

Before

After 5 minutes

Before, low magnification

Before, high magnification

**After 10 minutes at 45 deg. C,
Low magnification**

**After 10 minutes at 45 deg. C,
High magnification**

**After 10 minutes at 45 deg. C,
Higher magnification**

**After 10 minutes at 45 deg. C,
Highest magnification**

**After 20 minutes at 45 deg. C,
Low magnification**

**After 20 minutes at 45 deg. C,
High magnification**

After 20 minutes at 45 deg. C,
Higher magnification

After 20 minutes at 45 deg. C,
Highest magnification

**D2 & D3
65 deg. C    15 min**

**D6 - 75 deg. C    30 min
D13 RT    5 min**

Before, low magnification

Before, high magnification

F6/70 deg, C/10 minutes

F6/90 deg. C/10 minutes

F5/55 deg. C/10 minutes

F5/55 deg. C/30 minutes

F4/55 deg. C/10 minutes

F4/55 deg. C/30 minutes

COMPOSITIONS AND PROCESSES FOR PHOTORESIST STRIPPING AND RESIDUE REMOVAL IN WAFER LEVEL PACKAGING

CROSS-REFERENCE TO RELATED APPLICATIONS

This application claims priority to U.S. Provisional Patent Application No. 60/623,190, similarly titled and filed Oct. 29, 2004, and is a continuation-in-part of U.S. patent application Ser. No. 10/689,657 filed Oct. 22, 2003 now U.S. Pat. No. 7,135,445, which is a continuation-in-part of U.S. application Ser. No. 10/007,134, filed Dec. 4, 2001 now U.S. Pat. No. 7,157,415 now U.S. Published Application No. 2002/20134963, which is a divisional application of U.S. application Ser. No. 09/343,532, filed Jun. 30, 1999, now U.S. Pat. No. 6,417,112, which claims priority to U.S. Provisional Patent Application No. 60/092,024, filed Jul. 6, 1998, and is related to commonly-assigned, co-pending patent application, entitled "Compositions and Processes for Photoresist Stripping and Residue Removal in Wafer Level Packaging," filed on the same day as the instant application, and is related to commonly-assigned, co-pending patent application, entitled "Remover Compositions for Dual Damascene System," filed on the same day as the instant application, the entire contents of all of which are incorporated by reference herein.

TECHNICAL FIELD

The disclosed embodiments relate generally to the fabrication of integrated circuits, semiconductor packages, and printed circuit boards. More specifically, the embodiments relate to compositions and processes to remove polymer and clean etch/ash residues without damaging the underlying substrates or materials.

BACKGROUND

The recent trend to portable and wireless computing on the one hand and commodity prices for cell phones and personal computers (PCs) on the other hand has created a need for smaller integrated circuits (IC), IC packages, and electronic products that are low in cost, but capable of high performance. Wafer level packaging (WLP), including flip chip technologies, addresses this need.

WLP is IC packaging formed at the wafer level. With WLP, IC interconnects are fabricated en masse on the wafer, and complete IC modules can be built on the wafer before it is diced. Benefits gained using WLP include, for example, increased I/O density, improved operating speeds, enhanced power density and thermal management, and decreased package size.

One of the keys to WLP is the build up of flip-chip conductive interconnect bumps on the wafer. These interconnect bumps serve as electrical and physical connections of the semiconductor components to a printed wiring board. Several methods of forming interconnect bumps on semiconductor devices have been proposed, for example, solder plate bumping, evaporation bumping, conductive adhesive bonding, stencil printing solder bumping, stud bumping, and ball placement bumping. Of these techniques, it is believed that the most cost effective technique for forming fine pitch arrays is solder plate bumping, which involves a combination of a temporary photoresist plating mask and electroplating. This technique is being rapidly adopted as full-area interconnect bump technology for high value-added assemblies such as microprocessors, digital signal processors, and application specific integrated circuits.

In WLP, front-end IC fabrication and back-end IC assembly are performed at the wafer foundry. Immediately after wafer fabrication, but before testing, connections (e.g., solder bumps) are formed on the wafer. Then, testing and burn-in of the connections is done before singulating into packaged ICs. Flip chip technologies form electrical connections for face-down electrical components on substrates, circuit boards, or carriers using conductive bumps on IC bond pads.

During the WLP process, photolithography steps are required to delineate patterns on the wafers, such as for bond pad distribution and solder bump build-up. The photolithographic process includes stripping the photoresist and removing etch residues. Failure to effectively remove these materials can result in contamination, yield loss, downstream problems in testing and board-level assembly, and reliability fallout in the field.

Photoresists are commonly composed of acrylic resins, polyvinyl cinnamates, diazo compounds, phenol-formaldehydes, or other similar film-forming materials. Photoresists can be applied to the wafer surface dry (e.g., by lamination) or wet (e.g., by spin coating), as illustrated in FIGS. 1 and 2, respectively. Photoresists are further polymerized or cross-linked by ultraviolet light into hard, chemically-resistant films during photolithographic processing.

In the manufacture of semiconductor wafers and printed circuit boards (PCBs), a substrate is coated with photoresist. The photoresist is exposed to actinic radiation and then either the exposed or unexposed photoresist is removed with a suitable developer to produce a pattern in the remaining photoresist. The remaining photoresist protects covered areas of the underlying substrate. Exposed areas are either etched away (e.g., using wet etchants or plasma etching) or have additional materials deposited on them (e.g., via sputtering, chemical vapor deposition, electrochemical plating or electrode-less plating). A semiconductor wafer substrate may include on its surface exposed silicon, oxides, nitrides of silicon, low k dielectrics, or metals (e.g., copper, aluminum, tungsten, nickel, tin, lead, silver, gold, or alloys). A PCB may include many of the same materials. In addition, organic materials such as resists and fluxes are used in WLP for bump formation (e.g., copper post electroplating and solder paste bumping).

After etching or deposition, the remaining photoresist must be removed. The material that remains on the substrate is more difficult to remove. The challenge is to remove only the photoresist and not etch or corrode any other material or leave any residue from either the stripper or the photoresist. It is difficult to find a stripper that is selective in that manner, i.e., that strips or removes photoresist without attacking the other exposed materials in a processed wafer or PCB. What is desired is a stripper that produces an acceptable level of corrosion, below which further processing is unaffected and the electrical operation of the product is unaffected.

Conventional photoresist compositions and processes are not compatible with WLP processing, in part because of the high solder re-flow temperatures (e.g., 150° C.-400° C.) and large resist thicknesses used in WLP processing. Thus, new photoresists for WLP have been developed which, in turn, require new compositions and processes for photoresist stripping and residue removal.

Photoresist stripper products formulated around methyl-2-pyrrolidone (NMP) alone and NMP with alkanolamines, such as PRS100 from Baker, AZ400T from Clariant and EKC830 from EKC, are not effective for WLP because the process conditions effect the photoresist, making it difficult to remove due to, for example, cross linking and encrustation, making stripping of this photoresist unpredictable. Strippers migrating from conventional, low-density PCB processing, such as dimethylsulfoxide (DMSO) with alkaline base (e.g., NaOH or KOH) are not desirable for WLP packaging and high-density PCB applications due to possible metal ion contamination of the IC. Because the wafer level interconnect must be located in the active area of the die, very high input/output (I/O) ICs require very small solder balls with very tight pitches. For example, FIG. 1 shows an array of 30 micron solder balls with 100 micron pitch. High-density PCBs typically require using 25 micron or better photolithography for small solder balls on tight pitches to match the high I/O IC requirements. As the size of the solder balls decrease, the amount of unremoved photoresist required to prevent reliable electrical contact at a solder ball also decreases. Thus, it becomes increasingly important to completely remove the photoresist for smaller solder balls to provide the required quality of performance. Moreover, because the thicker photoresist layer (e.g., 10×) for WLP and PCB applications, compared with at the IC level, it is not predictable to one of skill in the art whether and which strippers used with ICs would work for WLP and PCB applications. Moreover, it is less acceptable to remove the photoresist by a lift-off process rather than a dissolved process due to the possibility of redeposition. Therefore, a need exists for formulations that increase the amount of photoresist dissolved as compared with lift-off.

PCBs are manufactured by plating a thin layer of copper on a substrate (e.g., a glass, ceramic, plastic film or epoxy-glass laminated board). A circuit pattern is formed in the copper layer using photoresist masking and copper etchant solutions. Alternatively, plating copper over a patterned photoresist layer can create the circuit pattern. In either case, the exposed highly crosslinked photoresist must be removed from the PCB substrate. Compositions and methods for removing photoresist from PCBs are described in U.S. Pat. Nos. 3,650,969; 3,600,322; 3,147,224; 3,075,923; 4,269,724; 4,278,577; 3,789,907; 3,625,763; 3,813,309; 3,625,763; 4,483,917; and 4,592,787. Most of the photoresist strippers disclosed contain methylene chloride, which is extremely toxic and is a cancer-causing agent.

Conventional photoresist strippers contain solvents and alkaline bases. Examples of solvent/alkaline mixture types of photoresist strippers that are known for use in stripping applications include dimethylacetamide or dimethylformamide and alkanolamines as described in U.S. Pat. Nos. 4,770,713 and 4,403,029; 2-pyrrolidone, dialkylsulfone and alkanolamines as described in U.S. Pat. Nos. 4,428,871, 4,401,747, and 4,395,479; and 2-pyrrolidone and tetramethylammonium hydroxide as described in U.S. Pat. No. 4,744,834. U.S. Pat. No. 5,962,197 describes a stripper for removing photoresist or solder masks using a mixtures of solvents, surfactants and 0.1 to 5% potassium hydroxide with water contents less than 1%. Potassium hydroxide, for example, causes undesirable oxidation effects on copper substrates, while less than 1% water causes stripped material to be less soluble or insoluble in the stripper. U.S. Pat. No. 5,091,103 describes photoresist stripper compositions comprising N-alkyl-2-pyrrolidone, 1,2-propanediol and tetraalkyammonium hydroxide. U.S. Pat. No. 5,846,695 discloses aqueous solutions of quaternary ammonium hydroxides, including choline, in combination with nucleophilic amines and sugar and/or sugar alcohols, for removal of photoresist and photoresist residues in integrated circuit fabrication. However, this patent requires sugar and/or sugar alcohols to prevent corrosion while the present invention is sugar and/or sugar alcohol free while still providing low rates of corrosion. Unfortunately, these photoresist strippers, as well as other aqueous strippers, are do not completely remove hard baked photoresist and attack the underlying substrate metallurgy, specifically where copper is used as the wiring material.

As the distance between copper lines in PCBs decreases (or, equivalently, as the pitch (lines/distance) in PCBs increases), conventional strippers become ineffective and the amount of photoresist remaining on the substrate increases. Complete resist stripping is needed to control plating distribution, to reduce over plating, and to avoid shorts on costly fine-line PCBs.

A new generation of photoresist stripper compositions and processes are required to address these problems in WLP and PCB manufacturing.

SUMMARY

The present invention overcomes the limitations and disadvantages described above by providing compositions and processes for removing polymers, post etch residues, and post oxygen ashing residues, particularly from ICs, WLP circuits on wafer substrates, and PCBs.

One aspect of the invention involves a method that comprises contacting a substrate with mixtures containing an effective amount of organic ammonium compound(s); from about 2 to about 20 weight percent of oxammonium compound(s); and water. The organic ammonium compound has the general structure:

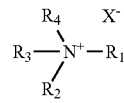

where:

X can be hydroxide; sulfate; hydrogen sulfate; phosphate; hydrogen phosphate; dihydrogen phosphate; nitrate; a carboxylate (e.g., acetate, benzoate, carbamate, formate, lactate, oxalate, hydrogen oxalate, citrate, hydrogen citrate, dihydrogen citrate, tartrate, hydrogen tartrate, gallate (subgallate), cinnamate, or the like); halide, such as chloride, fluoride, iodide, bromide, or the like; carbonate; hydrogen carbonate (bicarbonate); bifluoride; or the like;

$R_1$ can be an alkyl group (e.g., methyl, ethyl, propyl, butyl, etc.) or a group derived from the reaction of a tertiary amine with an organic epoxy; and $R_2$, $R_3$, and $R_4$ are not hydrogen and can independently be alkyl, benzyl, hydroxyalkyl, phenyl, a group derived from the reaction of a tertiary amine with an organic epoxy, or another group contained in a tertiary amine.

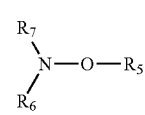

I

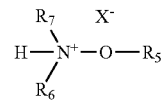

II

The oxammonium compound has one of the following structures:

where:

X can be hydroxide; sulfate; hydrogen sulfate; phosphate; hydrogen phosphate; dihydrogen phosphate; nitrate; a carboxylate (e.g., acetate, benzoate, carbamate, formate, lactate, oxalate, hydrogen oxalate, citrate, hydrogen citrate, dihydrogen citrate, tartrate, hydrogen tartrate, gallate (subgallate), cinnamate, or the like); halide, such as chloride, fluoride, iodide, bromide, or the like; carbonate; hydrogen carbonate (bicarbonate); bifluoride; or the like;

each $R_5$ can independently be hydrogen, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof; and each $R_6$ and $R_7$ can independently be hydrogen, a hydroxyl group, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof.

BRIEF DESCRIPTION OF THE DRAWINGS

For a better understanding of the aforementioned aspect of the invention as well as additional aspects and embodiments thereof, reference should be made to the Description of Embodiments below, in conjunction with the following figures.

DESCRIPTION OF EMBODIMENTS

Figure 1A:
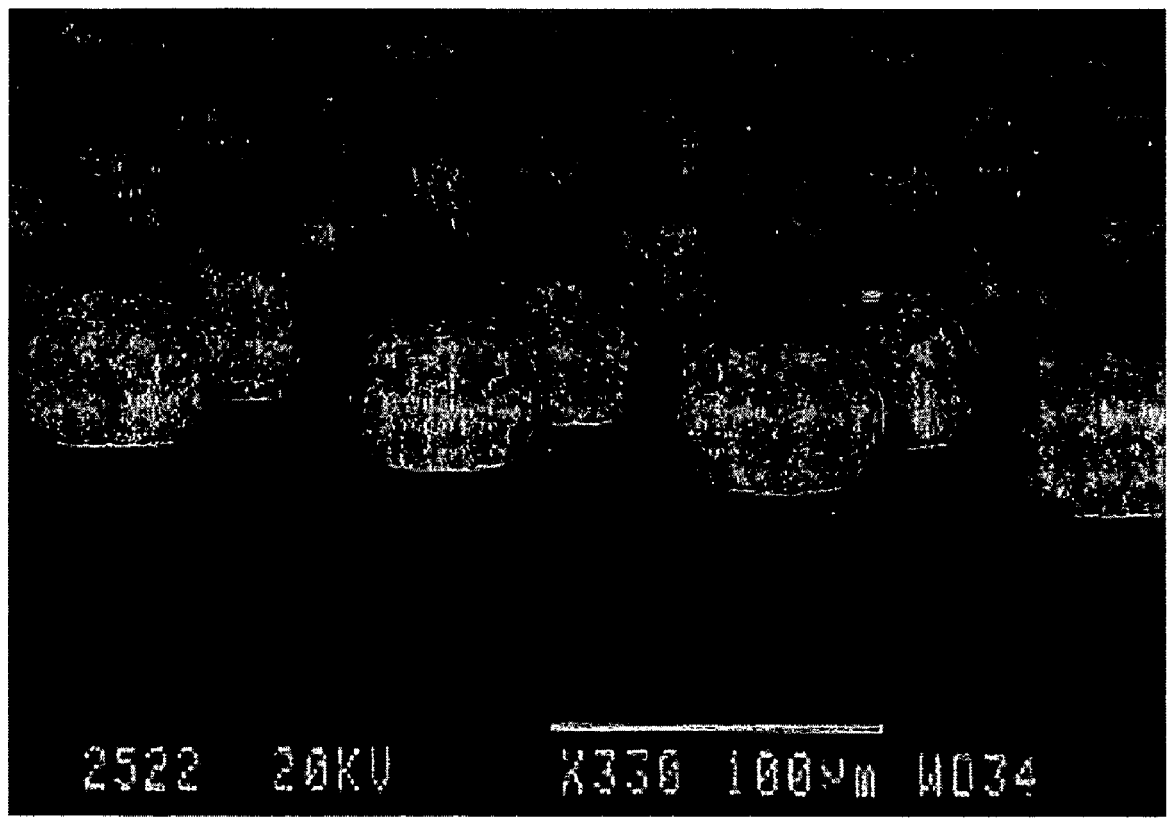
FIG. 1A shows an array of 30 micron solder bumps with 100 micron pitch.
Figure 1B:
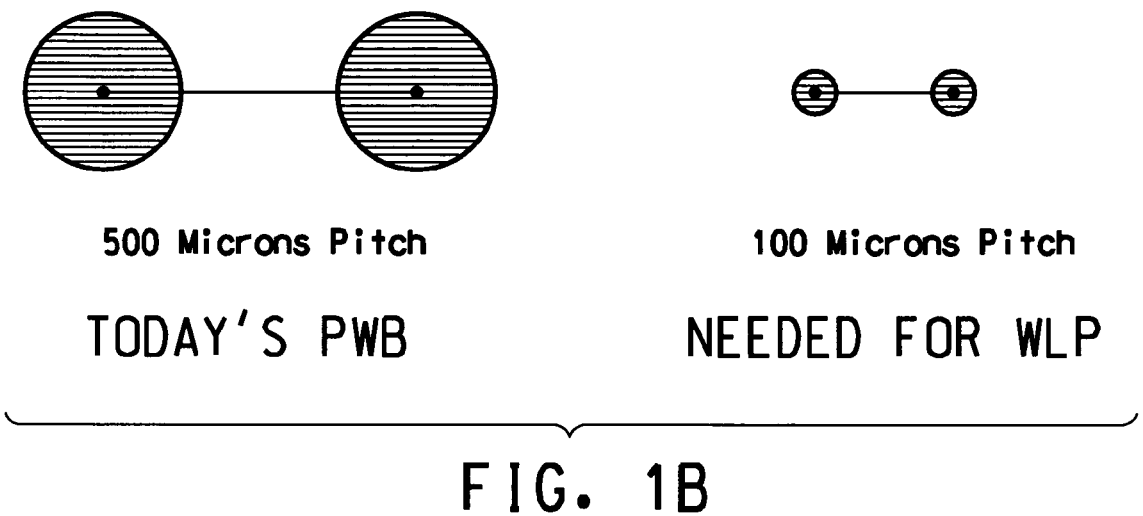
FIG. 1B shows the different sizes of solder bumps.

Compositions and processes are described for removing polymer and residues, particularly in ICs, WLPs, and PCBs. Reference will be made to certain embodiments of the invention, examples of which are illustrated in the accompanying tables and figures. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention as defined by the appended claims.

Moreover, in the following description, numerous specific details are set forth to provide a thorough understanding of the present invention. However, it will be apparent to one of ordinary skill in the art that the invention may be practiced without these particular details. In other instances, methods and procedures that are well-known to those of ordinary skill in the art are not described in detail to avoid obscuring aspects of the present invention.

An exemplary method for removing polymer, etch residue, or both from a substrate comprises contacting the substrate, on which a circuit or a portion of a circuit is typically present (e.g., a WLP or PCB substrate), with a composition according to the invention, containing an effective amount of organic ammonium compound(s), an effective amount of one or more oxammonium compounds, water, and optionally an organic solvent.

Advantageously, the composition according to the invention is capable of removing the polymer, the etch residue, or both from the substrate, while maintaining the operability of the circuit, or portion thereof, associated with the substrate. For example, this may occur when the removing does not substantially modify the FT-IR spectrum, the dielectric constant, the refractive index (RI), or the thickness of such materials after use.

The organic ammonium compound has the general structure:

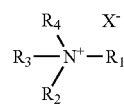

where:

X can be hydroxide; sulfate; hydrogen sulfate; phosphate; hydrogen phosphate; dihydrogen phosphate; nitrate; a carboxylate (e.g., acetate, benzoate, carbamate, formate, lactate, oxalate, hydrogen oxalate, citrate, hydrogen citrate, dihydrogen citrate, tartrate, hydrogen tartrate, gallate (subgallate), cinnamate, or the like); halide, such as chloride, fluoride, iodide, bromide, or the like; carbonate; hydrogen carbonate (bicarbonate); bifluoride; or the like;

$R_1$ can be an alkyl group (e.g., methyl, ethyl, propyl, butyl, etc.) or a group derived from the reaction of a tertiary amine with an organic epoxy; and $R_2$, $R_3$, and $R_4$ are not hydrogen and can independently be alkyl, benzyl, hydroxyalkyl, phenyl, a group derived from the reaction of a tertiary amine with an organic epoxy, or another group contained in a tertiary amine.

Additional examples of the organic ammonium compound include, without limitation: benzyltrimethylammonium hydroxide, dimethyldiethylammonium hydroxide, ethyltrimethylammonium hydroxide, methyltriethylammonium hydroxide, tetrabutylammonium hydroxide, tetraethylammonium hydroxide, tetramethylammonium hydroxide, tetrapropylammonium hydroxide, and the like, and combinations thereof.

In some embodiments, the organic ammonium compound is the product of a reaction between an organic epoxy with the general structure:

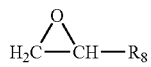

where $R_8$ can be hydrogen or alkyl, aromatic, and the like;

and a tertiary amine

that forms the organic ammonium hydroxide compound. Other organic ammonium compounds can be derived by reacting the hydroxide compound with various acids to form the corresponding organic ammonium salts.

Examples of the organic epoxy include, without limitation: ethylene oxide, 1,2 epoxypropane, 1,2 epoxybutane, 1,2 epoxycyclododecane, 1,2 epoxycyclopentane, 1,2 epoxydecane, 1,2 epoxy-9-decene, 1,2 epoxyethylbenzene, 1,2 epoxyhexane, 1,2 epoxy-3-methylbutane, 1,2 epoxynonane, 1,2 epoxyoctadecane, 1,2 epoxyoctane, 1,2 epoxypentadecane, 1,2 epoxypentane, 1,2 epoxy-3-phenoxypropane, 1,2 epoxytetradecane, 1,2 epoxytridecane, 1,2 epoxyundecane, and the like, and combinations thereof.

Examples of the tertiary amine include, without limitation: trimethylamine, triethylamine, tribenzylamine, tributylamine, tridodecylamine, triethanolamine, N,N,N'-triethylethylenediamine, trihexylamine, triisooctylamine, triisopropanolamine, N N 5 trimethylfurfurylamine, trioctylamine, triphenylamine, tris(2 aminoethyl)amine, tris[2-(2 methoxyethoxy)ethyl]amine, tri-p-tolylamine, tritylamine, $N_2$-alkyldiethylenetriamine, hexamethylenetetramine, N,N,N',N'-tetramethylethylenediamine, and the like, and combinations thereof.

In preferred embodiments, the organic ammonium compound contains at least one of the following: a choline salt (i.e., where one of $R_1$-$R_4$ is a hydroxyethyl moiety and the other three of $R_1$-$R_4$ are alkyl groups such as methyls), a bis-choline salt (i.e., where two of $R_1$-$R_4$ are hydroxyethyl moieties and the other two of $R_1$-$R_4$ are alkyl groups such as methyls), and a tris-choline salt (i.e., where three of $R_1$-$R_4$ are hydroxyethyl moieties and the other one of $R_1$-$R_4$ is an alkyl group such as a methyl). While the preferred salt counterion may be varied, a particularly preferred salt counterion for use in the composition according to the invention is a hydroxide counterion, with chloride, carbonate, and hydrogen carbonate counterions also being preferred.

The oxammonium compound is typically a reducing agent (i.e., has a reduction potential), must be miscible with water, and has one of the following structures:

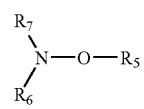

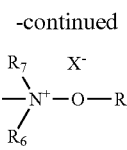

where:

X can be hydroxide; sulfate; hydrogen sulfate; phosphate; hydrogen phosphate; dihydrogen phosphate; nitrate; a carboxylate (e.g., acetate, benzoate, carbamate, formate, lactate, oxalate, hydrogen oxalate, citrate, hydrogen citrate, dihydrogen citrate, tartrate, hydrogen tartrate, gallate (subgallate), cinnamate, or the like); halide, such as chloride, fluoride, iodide, bromide, or the like; carbonate; hydrogen carbonate (bicarbonate); bifluoride; or the like;

each $R_5$ can independently be hydrogen, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof; and each $R_6$ and $R_7$ can independently be hydrogen, a hydroxyl group, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof.

Examples of the oxammonium compound include, without limitation: hydroxylamine, a hydroxylamine sulfate, a hydroxylamine phosphate, hydroxylamine chloride, hydroxylamine nitrate, a hydroxylamine citrate, N,N diethylhydroxylamine, isopropylhydroxylamine, and the like, and combinations thereof.

In preferred embodiments, the oxoammonium compound includes at least one of the following: hydroxylamine (i.e., in formula I, where all of $R_5$-$R_7$ are hydrogens), a hydroxylamine salt (i.e., in formula II, where where all of $R_5$-$R_7$ are hydrogens), and a hydroxylamine derivative (i.e., in formula I, e.g., where $R_5$ is a hydrogen and where $R_6$ and $R_7$ are independently $C_1$-$C_4$ alkyl groups). When an oxoammonium salt of formula II is present, a particularly preferred salt counterion for use in the composition according to the invention is a sulfate, hydrogen sulfate, or nitrate counterion, although carboxylate, chloride, phosphate, hydrogen phosphate, and dihydrogen phosphate are also preferred salt counterions.

In some embodiments, an organic polar solvent that is miscible with water may be included. Suitable organic polar solvents include, but are not limited to, alkanolamines and their derivatives. Additionally, non-amine solvents, such as dimethyl sulfoxide (DMSO), may be suitable for use. Suitable alkanolamines can include, but are not limited to, primary, secondary, or tertiary amines, and are preferably monoamines, diamines, or triamines. The alkanol group of the alkanolamines preferably has from about 1 to about 5 carbon atoms. Additionally or alternately, suitable alkanolamines can be represented by the chemical formula $R_{10}R_{11}$—N—$CH_2CH_2$—O—$R_{12}$, wherein each of $R_{10}$ and $R_{11}$ can independently be H, $CH_3$, $CH_3CH_2$, $CH_2CH_2OH$, or $CH_2CH_2$—N—$R_{10}R_{11}$, and wherein $R_{12}$ is H or $CH_2CH_2OH$. Examples of suitable alkanolamines can include, but are not limited to, monoethanolamine (MEA), diethanolamine, triethanolamine, aminoethylethanolamine (AEEA), tertiarybutyldiethanolamine, isopropanolamine, 2-amino-1-propanol, 3-amino-1-propanol, isobutanolamine, 2-amino-2-ethoxypropanol, 2-amino-2-ethoxy-ethanol, which is also known as diglycolamine, and combinations thereof.

Additional examples of organic polar solvents suitable for use can include, but are not limited to, N-methyl-2-pyrrolidinone, N,N-dimethylpropanamide, N,N-diethylformamide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine, and ethylenetriamine, dimethyl acetamide (DMAc), propylene glycol (PG), dipropylene glycol monomethyl ether (DPM), N-methylpyrrolidone (NMP), or cyclohexyl pyrrolidone (CHP), or mixtures thereof. Additional organic polar solvents miscible with water as known in the art can also be used.

When present in the composition according to the invention, preferred organic polar solvents are typically polar and can include, but are not necessarily limited to, NMP, DMSO, DGA, MEA, propylene glycol, and mixtures thereof. When present in the composition according to the invention, any solvent used must typically be organic, polar, and largely water-miscible.

In some embodiments, a chelating agent, which at times will also act to inhibit corrosion to certain materials, may be included. The chelating agents, when present, generally function to protect a metal (e.g., copper) from being corroded, and may be chosen from a variety of classes of chemical compounds, including any compounds used for the prevention of copper corrosion in other systems comprising the art.

More specifically, compounds of the general class:

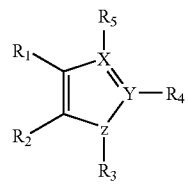

may be employed, where X, Y, and Z are independently chosen from C, N, O, S, P, and mixtures thereof. Under these conditions the valence requirements and presence of pendant R groups may be set appropriately. Pendant R groups $R_1$-$R_5$ may each independently include, without limitation: H; substituted $C_1$-$C_6$ straight, branched or cyclo alkyl, alkenyl or alkynyl group; straight or branched alkoxy group; substituted acyl group; straight or branched alkoxy group; amidyl group; hydroxyl group; halogen; carboxyl group; alkoxyalkyl group; alkylamino group; alkylsulfonyl group; sulfonic acid group; the salt of such compounds; or mixtures thereof. In one preferred embodiment X, Y, and Z are nitrogen, nitrogen, and carbon, respectively, and $R_1$-$R_5$ are each hydrogen. In another preferred embodiment, X, Y, and Z are each nitrogen, $R_3$ is hydrogen, and $R_4$ and $R_5$ are linked together with X and Y to constitute a 6-membered aromatic ring structure.

When present, preferred chelating agents are capable of complexing with materials removed by the compositions according to the invention and may include one or more of amino carboxylic acids such as N-hydroxyethyliminodiacetic acid, nitrilotriacetic acid (NTA), ethylenediaminetetraacetic acid (EDTA), N-hydroxyethylenediaminetriacetic acid (HEDTA), and diethylenetriaminepentaacetic acid (DTPA), cyclic carboxylic acids, as well as the salts of amino and cyclic carboxylic acids, such as saturated and unsaturated aliphatic and aromatic mono- and dicarboxylic acids having from 1 to 20, preferably from 2 to 10, more preferably from 2 to 6 carbon atoms, such as, for example, formic acid, acetic acid, propionic acid, butyric acid, caprylic acid, capric acid, lauric acid, myristic acid, palmitic acid, stearic acid, acrylic acid, propiolic acid, methacrylic acid, crotonic acid, isocrotonic acid and oleic acid, cyclohexanecarboxylic acid, benzoic acid, phenylacetic acid, o-, m-, p-toluic acid, o-, p-chlorobenzoic acid, o-, p-nitrobenzoic acid, salicylic acid, phthalic acid, naphthoic acid, cinnamic acid, nicotinic acid, and substituted acyclic and cyclic carboxylic acids such as e.g. lactic acid, malic acid, mandelic acid, salicylic acid, anisic acid, vanillic acid, veratroic acid, oxocarboxylic acids such as e.g. glyoxylic acid, pyruvic acid, acetoacetic acid, levulinic acid; alpha.-aminocarboxylic acids, i.e. all the α-aminocarboxylic acids such as e.g. alanine, arginine, cysteine, proline, tryptophan, tyrosine and glutamine, but also other aminocarboxylic acids such as e.g. hippuric acid, anthranilic acid, carbamic acid, carbazic acid, hydantoic acid, aminohexanoic acid, and 3- and 4-aminobenzoic acid; saturated and unsaturated dicarboxylic acids having from 2 to 20 carbon atoms, such as e.g. oxalic acid, malonic acid, succinic acid, glutaric acid, adipic acid, pimelic acid, suberic acid, azelaic acid, sebacic acid, maleic acid, fumaric acid, phthalic acid, isophthalic acid, terephthalic acid and sorbic acid, and esters of the abovementioned carboxylic acids, among

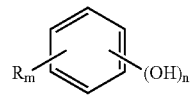

which the methyl, ethyl and ethylhexyl esters should be mentioned in particular.

Another class of chelating agents, which may act as copper corrosion inhibitors, the hydroxybenzenes, may be employed in the invention independently or in conjunction with the classes already cited herein. These comprise the general class:

wherein n=1-4, m=2-5 and R is independently hydrogen, a substituted $C_1$-$C_6$ straight, branched or cyclo alkyl, alkenyl, or alkynyl group; a substituted acyl group, straight or branched alkoxy group, amidyl group, halogen, carboxyl group, alkoxyalkyl group, aklylamino group, alkylsulfonyl group, or sulfonic acid group, or the salt of such compounds. Suitable specific examples of such chelating agents/corrosion inhibitors include, but are not limited to, catechol, t-butyl catechol and benzotriazole.

Typically, the amount of organic ammonium compound(s) present in the composition according to the invention can be varied, depending upon the chemical and/or physical nature of the photoresist/polymer and/or residue to be removed. In one embodiment, the composition according to the invention can contain from about 0.4% by weight to about 50% by weight, preferably from about 0.5% by weight to about 45% by weight, for example from about 1% by weight to about 30% by weight or from about 8% by weight to about 25% by weight, alternately from about 0.4% by weight to about 10% by weight, from about 15% by weight to about 45% by weight, or from about 9% by weight to about 23% by weight, of the organic ammonium compound(s).

Typically, the amount of the one or more oxammonium compounds present in the composition according to the invention can be varied, depending upon the chemical and/or physical nature of the photoresist/polymer and/or residue to be removed. In one embodiment, the composition according to the invention can contain from about 0.1% by weight to about 12% by weight, preferably from about 0.4% by weight to about 10% by weight, for example from about 0.5% by weight to about 5% by weight or from about 2% by weight to about 10% by weight, alternately from about 0.3% by weight to about 3% by weight or from about 3% by weight to about 11% by weight, of the one or more oxammonium compounds.

Typically, the amount of water present in the composition according to the invention can be varied, depending upon the chemical and/or physical nature of the photoresist/polymer and/or residue to be removed. In one embodiment, the composition according to the invention can contain from about 10% by weight to about 95% by weight, preferably from about 15% by weight to about 94% by weight, for example from about 20% by weight to about 90% by weight, alternately from about 12% by weight to about 30% by weight, from about 48% by weight to about 60% by weight, or from about 75% by weight to about 90% by weight, of water.

The amount of the optional organic solvent present in the composition according to the invention can be varied, depending upon the chemical and/or physical nature of the photoresist/polymer and/or residue to be removed. When present, the composition according to the invention can advantageously contain from about 10% by weight to about 95% by weight, preferably from about 25% by weight to about 85% by weight, for example from about 30% by weight to about 80% by weight or from about 45% by weight to about 75% by weight, alternately from about 2% by weight to about 40% by weight, from about 5% by weight to about 50% by weight, or from about 50% by weight to about 90% by weight, of the optional organic solvent.

The amount of the optional chelating agent(s) present in the composition according to the invention can be varied, depending upon the chemical and/or physical nature of the photoresist/polymer and/or residue to be removed. When present, the composition according to the invention can advantageously contain from about 0.1% by weight to about 10% by weight, preferably from about 0.2% by weight to about 8% by weight, for example from about 0.3% by weight to about 4% by weight or from about 0.5% by weight to about 5% by weight, alternately from about 0.01% by weight to about 1% by weight, from about 0.1% by weight to about 2% by weight, or from about 0.05% by weight to about 0.5% by weight, of the optional chelating agent(s).

Optionally, and usually only if necessary, pH adjustors may be used to maintain and/or modify the pH of the composition according to the invention, so that it is within a particular range that is effective for removing polymer, removing residue, or both from the substrate, while maintaining the operability of the circuit, or portion thereof, associated therewith. The pH of the composition may be adjusted to be more acidic or more basic, depending upon the application, and the particular pH adjustor(s) to be used may depend upon the desired pH shift, as well as a number of other factors, including, but not limited to, solubility in the composition; miscibility with the organic ammonium compound, the oxoammonium compound(s), the water, and any optional components (e.g., such as organic solvent(s)); corrosivity to metals (such as copper, aluminum, or the like); or the like. Acidic and basic pH adjustors that are compatible with circuit-based materials are well known in the art—they may include pH buffers, which contain acids/bases as well as salts, or merely acidic/basic compounds. If any optional pH adjustors were to be added to the compositions according to the invention, however, because of the basicity of the oxoammonium and/or organic ammonium compounds, they would typically only be acidic pH adjustors. Exemplary acidic pH adjustors can include: inorganic acids such as hydrochloric acid, nitric acid, sulfuric acid, phosphoric acid, and the like; organic acids such as carbonic acid, citric acid, and the like; and combinations thereof.

In situations where the composition according to the invention is being used for photoresist/polymer and/or residue removal on integrated circuit substrates, substrates in wafer-level packaging, or printed circuit/wafer boards, the desired pH of the composition is usually basic. In certain embodiments, it is desirable for the pH to be maintained and/or modified to be above about 7, for example above about 8 or above about 9. In certain embodiments, it is desirable for the pH to be maintained and/or modified to be in a range from about 7 to about 12, for example from about 8 to about 11.5 or from about 9 to about 11. In a most preferred embodiment, the pH of the composition according to the invention is maintained and/or modified to be at least about 12.

In one embodiment, the composition according to the invention can be substantially free from one or more of chelators, corrosion inhibitors, sugar alcohols, film-forming agents, surfactants, abrasive particles, alkanolamines, organic solvents, fluoride-containing compounds, oxidizing agents, reducing agents other than the oxoammonium compound, alkali metal-containing pH adjusting agents, unfunctionalized trialkylammonium compounds (i.e., with purely hydrocarbon groups covalently bonded to the nitrogen), and unfunctionalized tetraalkylammonium compounds (i.e., with purely hydrocarbon groups covalently bonded to the nitrogen). The phrase "substantially free from," as used herein in reference to a compound vis-à-vis a composition, should be understood to mean that the composition contains less than about 2% by weight, preferably less than about 1% by weight, for example less than about 0.1% by weight or less than about 0.01% by weight, of the compound. In some cases, the phrase "substantially free from" means that the composition contains none of the compound.

The compositions according to the invention can advantageously be used to strip/remove photoresist/polymer and/or organic residue from substrates (e.g., IC, WLP, and PCB substrates), including, but not limited to materials that are used to protect: IC connections, solder bumps, under-bump material (UBM), conductive metals (especially copper and copper alloys), refractory metals/metal alloys, refractory metal oxides/nitrides/oxynitrides, barrier layers, etch-stop layers, lift-off layers, dielectrics (especially low-K dielectrics), noble metals, and the like, and combinations and/or layered assemblies thereof.

While the compositions according to the invention are most often used in applications where (positive or negative) photoresists and/or polymer residue are being stripped/removed from IC, WLP, and PCB substrates, their usefulness is no so limited. Indeed, without being bound to theory, it is believed that the compositions according to the invention can be used to remove, from a wide variety of substrates, undesired material such as polymers (which, as used herein, should be understood to include homopolymers, copolymers, oligomers, dimers, monomers, and combinations or reactions products thereof), and other organic and/or organometallic material, specifically which contains somewhere within the molecular structure (and which is reasonably accessible) a carbonyl moiety, a carboxyl moiety, a nitrile moiety, an imide moiety, or a combination thereof. In a preferred embodiment, the undesired material specifically contains a carboxyl moiety.

Typically, companies fabricating IC, WLP, and PCB substrates with smaller feature sizes (e.g., 0.18 microns or less, or about 0.10 microns) have been moving to so-called "193" photoresists, which are so named because of the wavelength of light/energy to which they are generally exposed (e.g., for curing)—193 nm. Nevertheless, along with standard 193 photoresists, the compositions according to the invention can be particularly useful in stripping/removing polymers that have significant transparency to deep ultraviolet (DUV) radiation. As used herein, the terms "deep ultraviolet" or "DUV" refer to ultraviolet radiation having a wavelength less than about 250 nm. Thus, polymers having significant transparency to DUV include those polymers that are used as not only 193 nm photoresists, but also those used as 248 nm photoresists and as 157 nm photoresists. Such DUV-transparent polymers can include, but are not limited to, poly(acrylate)s, poly(alkyl acrylate)s, poly(alkacrylate)s, poly(alkyl alkacrylate)s, poly(acrylic acid) or at least partially neutralized salts thereof, poly(alkyl acrylic acid)s or at least partially neutralized salts thereof, poly(alkacrylic acid)s or at least partially neutralized salts thereof, poly(alkyl alkacrylic acid)s or at least partially neutralized salts thereof, poly(vinyl acetate), polyimides, polyamides, polyesters, carboxylated polymers, poly(ether-ether-ketone)s, poly(ether-ketone-ketone)s, polyketones, poly(vinylcarbamate)s, polyaldehydes, polyanhydrides, polycarbonates, polyurethanes, polyureas, poly(urethaneurea)s, poly(acrylonitrile), and the like, and mixtures, combinations, and copolymers thereof. Most, if not all, standard 193 photoresists (and indeed most DUV-transparent photoresists, in general) contain an enumerated functional group (e.g., carboxyl) in at least one (co)polymer repeat unit. Even newer 157 photoresists, which are composed largely of fluorinated copolymers, and other "next generation" photoresists, such as those disclosed in an article by Hiroshi Ito (in *Adv. Polym. Sci.*, 172:121-139, 2005), the contents of which are hereby incorporated by reference, typically contain one or more of the enumerated functional groups in at least one of their (co)polymer repeat units.

Other examples of photoresists/polymers removable by compositions according to the invention can be found, inter alia, in U.S. Pat. Nos. 6,610,456; 6,670,095; 6,683,202; 6,692,887; 6,727,032; 6,730,452; 6,737,215; 6,749,989; 6,794,110; and 6,818,377, as well as the following publications: N. L. Brakensiek et al., "Wet-recess Process Optimization of a Bottom Antireflective Coating for the Via First Dual Damascene Scheme," *Proc. SPIE: Adv. in Resist Tech. & Proc. XII*, v. 5376 (J. Sturtevant, ed.), 2004; C. J. Neef et al., "New BARC Materials for the 65-nm Node in 193-nm Lithography," *Proc. SPIE: Adv. in Resist Tech. & Proc. XII*, v. 5376 (J. Sturtevant, ed.), 2004; L. He et al., "Bottom Anti-Reflective Coatings (BARCs) for 157-nm Lithography," *Proc. Soc. Photo-Optical Instrum. Eng.*, 2003; J. D. Meador et al., "193-nm Multilayer Imaging Systems," *Proc. Soc. Photo-Optical Instrum. Eng.*, 2003; J. D. Meador et al., "New Materials for 193-nm Trilayer Imaging," *Proc. SPIE: Adv. in Resist Tech. & Proc. XII*, v. 5376 (J. Sturtevant, ed.), 2004; M. Bhave et al., "Developer-soluble Gap fill materials for patterning metal trenches in Via-first Dual Damascene process," *Proc. SPIE: Adv. in Resist Tech. & Proc. XII*, v. 5376 (J. Sturtevant, ed.), 2004; M. Weimer et al., "New Material for 193-nm Bottom Anti-Reflective Coatings," *Proc. Soc. Photo-Optical Instrum. Eng.*, 2003; R. Huang, "Via fill properties of organic BARCs in Dual Damascene application," *Proc. SPIE: Adv. in Resist Tech. & Proc. XII*, v. 5376 (J. Sturtevant, ed.), 2004; and K. A. Nowak, "Void Elimination Research in Bottom Anti-Reflective Coatings for Dual Damascene Lithography," *Proc. Soc. Photo-Optical Instrum. Eng.*, 2003, the contents of each of which are hereby incorporated by reference in their entirety.

Additionally or alternately, the compositions according to the invention can be useful in stripping/removing polymers that do not contain carbonyl/carboxyl groups on or pendant to the polymer backbone, but which are crosslinked (e.g., ionically, covalently, via complexation, etc.) with compounds possessing at least one enumerated group (i.e., carbonyl, carboxyl, nitrile, and imide), or typically at least two enumerated groups (e.g., crosslinkers such as glutaraldehyde, adipic acid, succinic acid, etc.).

The compositions according to the invention can be used in methods according to the invention for removing polymer, removing photoresist residue, or both from a substrate that can contain a single or dual damascene architecture and that has features (such as vias or interconnects) created using "via-first" and "trench-first" design principles, which are discussed in more detail in a commonly-assigned, co-pending patent application, entitled "POST ETCH CLEANING AND STRIPPING COMPOSITIONS FOR DUAL DAMASCENE SYSTEM," filed on the same day as the instant application, which is hereby incorporated by reference in its entirety.

Another embodiment of the invention provides a cleaning composition and cleaning process which will effectively clean residues on both sidewalls and tops of vias, including fences and crowns resulting from dual damascene processing and also removes polymeric material used in the etching process after the via is etched.

Another embodiment of the invention provides a cleaning composition and cleaning method that will effectively clean post etch residues from a via bottom.

In accordance with one aspect of the invention, it has been discovered that the traditional way of cleaning the dual damascene structure cannot be efficiently applied on this combination of materials. A "2 step etch process" can be used to achieve the requirement of ULSI manufacturing.

In accordance with another aspect of the invention, a new cleaning chemistry is provided in order to address the problem of dual damascene fabrication, such as trench-first processes. This work starts with a wide screening of possible candidates compatible with copper and SiLK or other low-k or porous dielectric materials, the two main materials of interest in this aspect of the invention, resulting in the design of a new chemistry. This new cleaning chemistry is evaluated on damascene structures. This work is supported by scanning electron microscopy (SEM), transmission electron microscopy (TEM), and time-of-flight secondary ion mass spectrometry (TOF-SIMS) analyses on the features integrating copper, and by FT-IR and C(V) measurement for the integration of SiLK.

In accordance with a further aspect of the invention, an etch stop inorganic layer at the bottom of the dual damascene structure protects the underlying interconnect of copper and allows us to proceed to a better cleaning. In this aspect of the invention, an integrated circuit fabrication process comprises forming a first silicon compound etch stop layer over a copper conducting line in the integrated circuit. A second silicon compound bulk dielectric is formed over the first silicon compound etch stop layer. The second silicon compound bulk dielectric is etched to expose the etch stop layer. Residues are removed from the integrated circuit. The etch stop layer is etched away to expose the copper conducting line. Residues, photoresist, polymers, and/or sacrificial material are removed from the integrated circuit with compositions according to the present invention.

In accordance with another aspect of the invention, a first etch stop inorganic layer (e.g., silicon nitride) at the bottom of the dual damascene structure protecting the underlying interconnect of copper may optionally be used over the copper but is unnecessary using the chemistries of the present invention. A first interlayer dielectric made of low-k or ultra low-k dielectric is formed on the optional first etch stop layer or directly over the copper line. A second etch stop inorganic layer (e.g., silicon nitride) may optionally be formed over the first interlayer dielectric. A second interlayer dielectric made of low-k or ultra low-k dielectric is formed on the optional second etch stop layer. The second layer is coated with photoresist, lithographically patterned, and an anisotropic dry etch cuts through the surface for a time sufficient to form a trench in the second interlayer dielectric or optionally to the second etch stop layer. A polymeric material is applied the etched trough and the unetched second interlayer dielectric. The via etch may then be etched through the polymeric material through lithographically patterned photoresist or through a hard mask. The via is either then etched to the copper substrate or etched to the first stop layer. If applicable, the first stop layer is removed with a special etch and the etch residues and polymeric material is removed with a composition according to the present invention.

The photoresist/polymer may, in some embodiments, be used as an antireflective coating, e.g., for front-end and/or back-end lithography, including conformal products to cover topography and planarizing products to fill trenches and vias in dual damascene (DD) technology, such as barrier or bottom anti-reflective coating materials (BARCs) or gap-fill coating materials. Examples of such coating materials include, but are in no way limited to, inter alia, those sold under the tradenames DUV, ARC, i-CON, XHRi, XHRiC, and IMBARC, which are commercially available from Brewer Science, Inc.; those sold under the tradenames DUO, ACCU-FILL, and ACCUFLO, which are commercially available from Honeywell Electronic Materials; those sold under the tradename AR, which are commercially available from Rohm & Haas Electronic Materials Microelectronic Technologies; and the like.

Further, in some embodiments, the photoresist/polymer may be modified prior to stripping/removal. Exemplary modifications can include, but are not limited to, chemical amplification, chemical etching, deep ultraviolet (DUV) treatment, ion implantation, plasma treatment, gamma- or x-ray irradiation, electron beam treatment, laser ablation, or the like, or a combination thereof.

Without being bound by theory, it is believed that the combination of components in the compositions according to the invention, namely the organic ammonium compound(s), the oxoammonium compound(s), the water, and the optional organic solvent (as well as any other optional components) act synergistically to achieve their desired goal. For instance, U.S. Pat. No. 5,091,103 discloses using a composition having a very low oxoammonium content to remove photoresist from a printed circuit/wire board substrate through a flake-off or lift-off process (where the photoresist material/residue had a low solubility in the stripping composition). On the contrary, the compositions and methods of the instant invention utilize the concept of ionization solubility to optimize the relative contributions of the different components in removing photoresist/polymer from a substrate, where the photoresist/ polymer/residue removed from the substrate has a measurably higher solubility in the composition according to the invention than in prior art compositions. The ionization solubility concept is described herein using an exemplary composition containing a choline salt, a hydroxylamine compound, water, and an optional organic solvent.

On one hand, choline salts are relatively strong bases, and therefore, in the presence of photoresist/polymer containing carbonyl, imide, and/or nitrile groups, e.g., a carboxylic acid group, they should theoretically interact with the carboxylic acid group proton to create a carboxylate salt, ideally which has increased solubility in the composition according to the invention as compared to the carboxylic acid group itself. On another hand, hydroxylamine compounds are relatively strong nucleophiles, and therefore, in the presence of photoresist/polymer containing carbonyl, imide, and/or nitrile groups, e.g., again using a carboxylic acid or a carboxylate group as an example, they should theoretically interact with the carbonyl carbon thereof (which is a partially positively charged site) to form a moiety that is usually quite different from a carboxylic acid/carboxylate group, and ideally which moiety has increased solubility in the composition according to the invention as compared to the carboxylic acid group itself. Furthermore, the water, which is extremely polar and exhibits increased dipole moment, can thus serve to solubilize (or increase the chances for solubility of) in the composition according to the invention the moieties (and thus the polymers to which they are linked) formed by the action of the organic ammonium and oxoammonium compounds mentioned above. In addition, the optional organic solvent, which can be chosen to be as generally compatible as possible with the photoresist/polymer used, can thus serve to solublize (or increase the chances for solubility of) the portions of the photoresist/polymer that remain unaltered by the action of the organic ammonium and oxoammonium compounds mentioned above.

As a result, one of ordinary skill in the art can manipulate the relative contents of each of these components in the compositions according to the invention to accommodate: photoresists/polymers having relatively low molecular weights and/or less crosslinking (e.g., increase organic ammonium content); photoresists/polymers having relatively high molecular weights, high crosslinking, and/or high content of enumerated groups (e.g., increase oxoammonium content); residue having relatively high ionization content (e.g., increase water content); residue having relatively low ionization content and/or relatively high content of enumerated groups (e.g., increase organic solvent content, or add some); etc. Therefore, in one embodiment, the solubility of the photoresist/polymer residue in the composition according to the invention is advantageously: 1) greater than the solubility of the photoresist/polymer residue in the composition without any oxoammonium compound; 2) greater than the solubility of the photoresist/polymer residue in the composition without any organic ammonium compound; or 3) preferably both. In another embodiment, after removal (e.g., by filtration) of insolubles, the concentration of the photoresist/polymer residue dissolved in the composition according to the invention is advantageously: 1) greater than the concentration of the photoresist/polymer residue that would be dissolved in the composition without any oxoammonium compound; 2) greater than the concentration of the photoresist/polymer residue that would be dissolved in the composition without any organic ammonium compound; or 3) preferably both.

Whatever the type of photoresist/polymer/residue on the substrate, i.e., positive or negative, the compositions according to the invention can be broadly tailored for effective and safe removal. Because of the aforementioned synergy and ionization solubility action of the components, the compositions according to the invention can be effective in removing photoresist/polymer/residue not only for thicknesses typical of integrated circuit/electronic chip manufacture (e.g., from about 0.5 microns to about 5 microns in thickness), but also for photoresist/polymer/residue that has a thickness one or two orders of magnitude higher, such as used in wafer-level packaging and printed circuit/wire board fabrication (e.g., from about 10 microns to about 150 microns, and even thicker). Because, generally, the thicker a photoresist/polymer is, the more crosslinked and/or the higher molecular weight it exhibits, thicker photoresist/polymer/residue typically implicates higher oxoammonium compound content, whereas thinner photoresist/polymer/residue can implicate lower oxoammonium compound content and/or higher organic ammonium compound content.

EXAMPLES

The following Examples are meant merely to illustrate some aspects of the present invention that may or may not be preferred. They are not intended to encapsulate the preferred invention nor unduly limit the scope of the appended claims in any way.

Tables 1-7 summarize some exemplary compositions. Note that the percentages listed in the right hand column are for components that are themselves percentages. For example, for solution A9, there is 20% of a solution of 45% choline hydroxide in water; 5% of a solution of 50% hydroxylamine in water; and 70% additional water. Thus, the actual weight percentage of choline hydroxide in solution A9 is about 9% (i.e., 0.20×45%=9%), the actual weight percentage of hydroxylamine in solution A9 is about 2.5% (i.e., 0.05× 50%=2.5%), and about the remaining 88.5% is water [i.e. (0.20×55%)+(0.05×50%)+70%=88.5%].

TABLE 1

Compositions

| Solution | Components | Total |
|---|---|---|
| A1 | N-Methyl-2-Pyrrolidone (NMP) | 100 |
| A2 | Diglycolamine (DGA) | 50 |
|  | N-METHYL-2-PYRROLIDONE (NMP) | 50 |
| A3 | N-Hydroxyethyl-2-Pyrrolidone (HEP) | 50 |
|  | N-METHYL-2-PYRROLIDONE (NMP) | 50 |
| A4 | Aromatic Solvent | 85 |
|  | Dodecylbenzenesulfonic acid | 15 |
| A5 | Aromatic Solvent | 60 |
|  | Catechol | 5 |
|  | Dodecylbenzenesulfonic acid | 35 |
| A6 | 45% Choline Hydroxide | 100 |
|  | Addition DIW | 0 |
| A7 | 45% Choline Hydroxide | 50 |
|  | Propylene Glycol (PG) | 50 |
| A8 | Choline Hydroxide (45%) | 25 |
|  | HYDROXYLAMINE FREEBASE (50%) | 5 |
|  | Addition DIW | 70 |
| A9 | Addition DIW | 75 |
|  | Choline Hydroxide (45%) | 20 |
|  | HYDROXYLAMINE FREEBASE (50%) | 5 |
| A10 | Propylene Glycol (PG) | 50 |
|  | Choline Hydroxide (45%) | 48.8 |
|  | hydroxylamine sulfate | 1.3 |

TABLE 2

Compositions

| | | |
|---|---|---|
| B1 | Choline Hydroxide (45%) | 100 |
|  | Addition DIW | 0 |
| B2 | Choline Hydroxide (45%) | 50 |
|  | Addition DIW | 50 |
| B3 | Choline Hydroxide (45%) | 25 |
|  | Addition DIW | 75 |
| B4 | Choline Hydroxide (45%) | 10 |
|  | Addition DIW | 90 |
| B5 | Addition DIW | 64.8 |
|  | Choline Hydroxide (45%) | 34.9 |
|  | HYDROXYLAMINE SULFATE (HAS) | 0.4 |
| B6 | Addition DIW | 72.4 |
|  | Choline Hydroxide (45%) | 22.6 |
|  | HYDROXYLAMINE FREEBASE ™ (50%) | 5 |
| B7 | Addition DIW | 63.4 |
|  | Choline Hydroxide (45%) | 31.6 |
|  | HYDROXYLAMINE FREEBASE ™ (50%) | 5 |
| B8 | Addition DIW | 75 |
|  | Choline Hydroxide (45%) | 20 |
|  | HYDROXYLAMINE FREEBASE (50%) | 5 |
| B9 | Addition DIW | 70 |
|  | Choline Hydroxide (45%) | 30 |
|  | HYDROXYLAMINE FREEBASE (50%) | 0 |
| B10 | Addition DIW | 67.5 |
|  | Choline Hydroxide (45%) | 30 |
|  | HYDROXYLAMINE FREEBASE (50%) | 2.5 |
| B11 | Addition DIW | 65 |
|  | Choline Hydroxide (45%) | 30 |
|  | HYDROXYLAMINE FREEBASE (50%) | 5 |
| B12 | Addition DIW | 60 |
|  | Choline Hydroxide (45%) | 30 |
|  | HYDROXYLAMINE FREEBASE (50%) | 10 |
| B13 | Addition DIW | 58 |
|  | Choline Hydroxide (45%) | 30 |
|  | HYDROXYLAMINE FREEBASE (50%) | 12 |
| B14 | Addition DIW | 50 |
|  | Choline Hydroxide (45%) | 30 |
|  | HYDROXYLAMINE FREEBASE (50%) | 20 |

TABLE 3

Compositions

| | | |
|---|---|---|
| C1 | Addition DIW | 71.5 |
|  | Choline Hydroxide (45%) | 25.7 |
|  | HYDROXYLAMINE FREEBASE (50%) | 2.8 |
| C2 | Addition DIW | 65 |
|  | Choline Hydroxide (45%) | 30 |
|  | HYDROXYLAMINE FREEBASE (50%) | 5 |
| C3 | Addition DIW | 60 |
|  | Choline Hydroxide (45%) | 30 |
|  | HYDROXYLAMINE FREEBASE (50%) | 10 |
| C4 | Addition DIW | 51 |
|  | Ammonium Fluoride 40% (AF) | 4 |
|  | Choline Hydroxide (45%) | 30 |
|  | DIMETHYLSULFOXIDE (DMSO) | 10 |
|  | HYDROXYLAMINE FREEBASE (50%) | 5 |
| C5 | Addition DIW | 13 |
|  | Choline Hydroxide (45%) | 21.7 |
|  | HYDROXYLAMINE FREEBASE (50%) | 4.4 |
|  | N-METHYL-2-PYRROLIDONE (NMP) | 60.87 |
| C6 | Addition DIW | 0 |
|  | Choline Hydroxide (45%) | 25 |
|  | DIMETHYLSULFOXIDE (DMSO) | 70 |
|  | HYDROXYLAMINE FREEBASE (50%) | 5 |
| C7 | Addition DIW | 70 |
|  | Choline Hydroxide (45%) | 25 |
|  | HYDROXYLAMINE FREEBASE (50%) | 5 |
| C8 | Addition DIW | 75 |
|  | Choline Hydroxide (45%) | 20 |
|  | HYDROXYLAMINE FREEBASE (50%) | 5 |

TABLE 4

| | Compositions | |
|---|---|---|
| D2 | 45% Choline Hydroxide | 25 |
| | HYDROXYLAMINE FREEBASE (50%) | 5 |
| | N-METHYL-2-PYRROLIDONE (NMP) | 70 |
| D3 | 45% Choline Hydroxide | 2.2 |
| | DIW Added | 22.8 |
| | HYDROXYLAMINE FREEBASE (50%) | 5 |
| | N-METHYL-2-PYRROLIDONE (NMP) | 70 |
| D6 | CATECHOL | 5 |
| | DIGLYCOLAMINE (DGA) | 60 |
| | HYDROXYLAMINE FREEBASE ™ (50%) | 35 |
| D8 | Addition DIW | 70 |
| | Choline Hydroxide (45%) | 25 |
| | HYDROXYLAMINE FREEBASE ™ (50%) | 5 |
| D9 | Addition DIW | 75 |
| | Choline Hydroxide (45%) | 20 |
| | HYDROXYLAMINE FREEBASE ™ (50%) | 5 |
| D10 | 45% Choline Hydroxide | 47.5 |
| | 50% Hydroxylamine | 2.5 |
| | Hydroxylamine Sulfate | 0 |
| | Propyleneglycol (PG) | 50 |
| D11 | 45% Choline Hydroxide | 24.4 |
| | 50% Hydroxylamine | 5 |
| | DIW Added | 70 |
| | Hydroxylamine Sulfate | 0.63 |
| D12 | 45% Choline Hydroxide | 23.75 |
| | 50% Hydroxylamine | 6.25 |
| | DIW Added | 70 |

TABLE 5

| | Compositions | |
|---|---|---|
| E1 | Addition DIW | 70 |
| | Choline Hydroxide (45%) | 25 |
| | HYDROXYLAMINE FREEBASE ™ (50%) | 5 |
| E4 | 45% Choline Hydroxide | 1 |
| | HYDROXYLAMINE FREEBASE ™ (50%) | 5 |
| | DIW Added | 94 |
| E5 | 45% Choline Hydroxide | 22.75 |
| | HYDROXYLAMINE FREEBASE ™ (50%) | 2.5 |
| | DIW Added | 74.75 |
| E7 | 45% Choline Hydroxide | 8.25 |
| | HYDROXYLAMINE FREEBASE ™ (50%) | 2.5 |
| | DIW Added | 89.25 |
| E9 | 45% Choline Hydroxide | 15.5 |
| | HYDROXYLAMINE FREEBASE ™ (50%) | 5 |
| | DIW Added | 79.5 |
| E10 | 45% Choline Hydroxide | 8.25 |
| | HYDROXYLAMINE FREEBASE ™ (50%) | 7.5 |
| | DIW Added | 84.25 |
| E11 | 45% Choline Hydroxide | 30 |
| | HYDROXYLAMINE FREEBASE ™ (50%) | 5 |
| | DIW Added | 65 |
| E12 | 45% Choline Hydroxide | 15.5 |
| | HYDROXYLAMINE FREEBASE ™ (50%) | 10 |
| | DIW Added | 74.5 |
| E13 | 45% Choline Hydroxide | 1 |
| | HYDROXYLAMINE FREEBASE ™ (50%) | 10 |
| | DIW Added | 89 |
| E14 | 45% Choline Hydroxide | 30 |
| | HYDROXYLAMINE FREEBASE ™ (50%) | 10 |
| | DIW Added | 60 |
| E15 | 45% Choline Hydroxide | 22.75 |
| | HYDROXYLAMINE FREEBASE ™ (50%) | 7.5 |
| | DIW Added | 69.75 |
| F1 | DGA | 50 |
| | NMP | 50 |
| F2 | Aromatic Solvent | 60 |
| | Catechol | 5 |
| | Dodecylbenzenesulfonic acid | 35 |
| F3 | Propylene Glycol (PG) | 50 |
| | Choline Hydroxide (45%) | 50 |
| F4 | DIW Added | 71.4 |
| | Glycolic Acid (70%) | 5 |
| | HYDROXYLAMINE FREEBASE (50%) | 17.6 |
| | MONOETHANOLAMINE (MEA) | 6 |
| F5 | Addition DIW | 70 |
| | Choline Hydroxide (45%) | 25 |
| | HYDROXYLAMINE FREEBASE ™ (50%) | 5 |
| F6 | DMSO | 30 |
| | MEA | 70 |

TABLE 6

| | Compositions | |
|---|---|---|
| Ingredient | M19 | M24 |
| 50% Hydroxylamine | 35 | 10 |
| CATECHOL | 5 | 4 |
| Choline Bicarbonate | 2 | 12 |
| DIGLYCOLAMINE (DGA) | 58 | 0 |
| DIW Added | 0 | 14 |
| MONOETHANOLAMINE (MEA) | 0 | 60 |
| Resist Removal | Completely Dissolved | Completely Dissolved |

TABLE 7

| | Compositions | | |
|---|---|---|---|
| Ingredient | M2 | M3 | M4 |
| Ammonium Fluoride 40% (AF) | 2.5 | 2.5 | 2.5 |
| 45% Choline Hydroxide | 30 | 30 | 15 |
| 50% Hydroxylamine | 5 | 5 | 5 |
| DIW Added | 60 | 30 | 45 |
| Hydroxylamine Sulfate | 2.5 | 2.5 | 2.5 |
| PROPYLENEGLYCOL (PG) | 0 | 30 | 30 |
| Resist Removal | Complete - Dissolved | Complete - Lift Off | Complete - Lift Off |

Copper Etch Rates in Choline Hydroxide Solutions with Hydroxylamine Compounds

Copper etch rates at various choline hydroxide concentrations in water were evaluated at 35° C. for times ranging from 2 to 30 minutes. The copper thickness loss was determined by four-point probe measurements of the change in sheet resistance of blanket samples with time. The copper thicknesses lost versus process times are listed in Table 2. FIG. 5 is a plot of copper thickness lost against exposure time at 35° C. Choline solutions with concentrations from about 11 to about 16% gave the highest copper etch rates.

TABLE 8

Cu thickness loss (Angstroms) versus time for Solutions B1-B4

| Time (min) | Solution B1 | Solution B2 | Solution B3 | Solution B4 |
|---|---|---|---|---|
| 2 | 13 | 34 | 39 | 16 |
| 5 | 73 | 64 | 77 | 16 |
| 10 | 64 | 96 | 124 | 29 |
| 20 | 85 | 167 | 228 | 32 |
| 30 | 127 | 262 | 298 | 45 |

Figure 2:
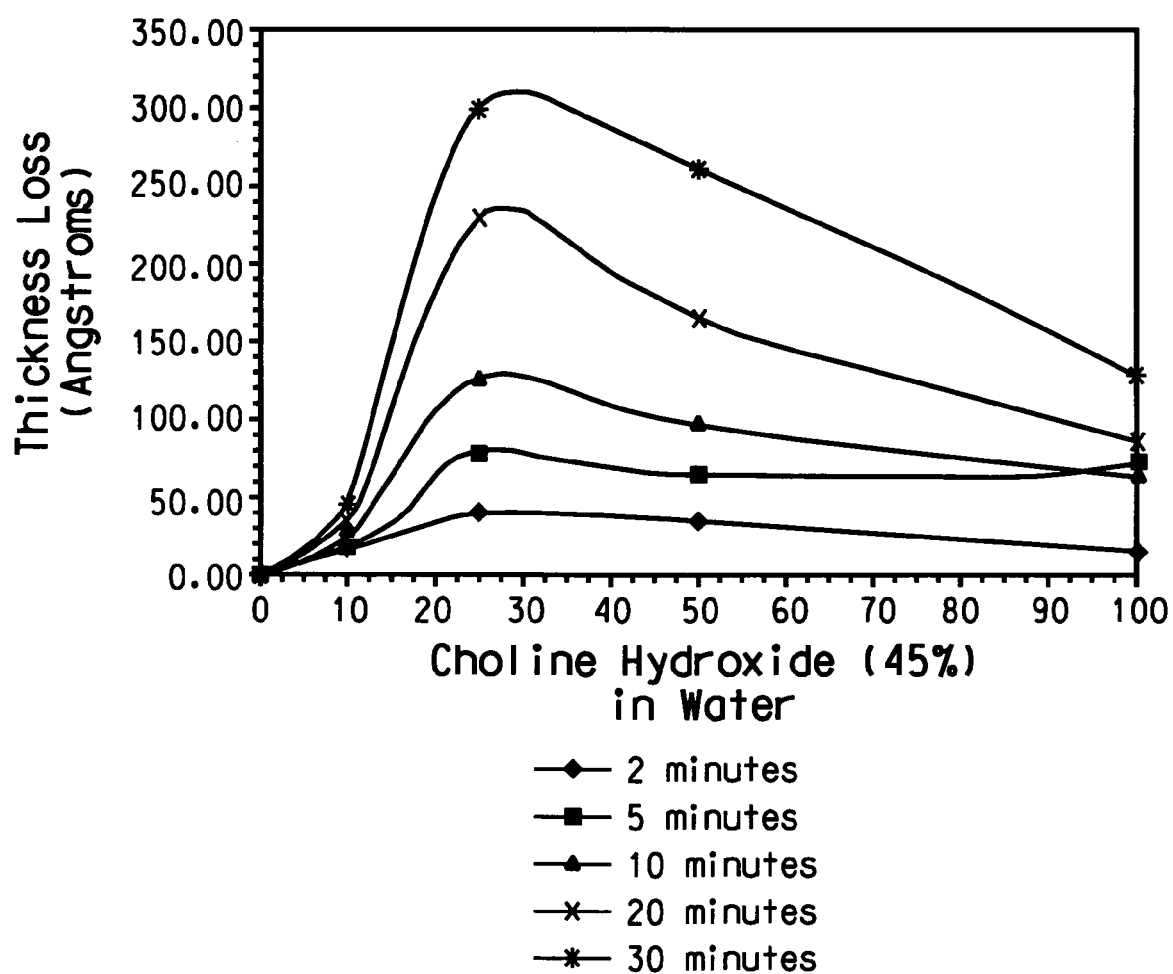
FIG. 2 is a plot of copper thickness lost against exposure time at 35° C. for various choline hydroxide concentrations.
Figure 3:
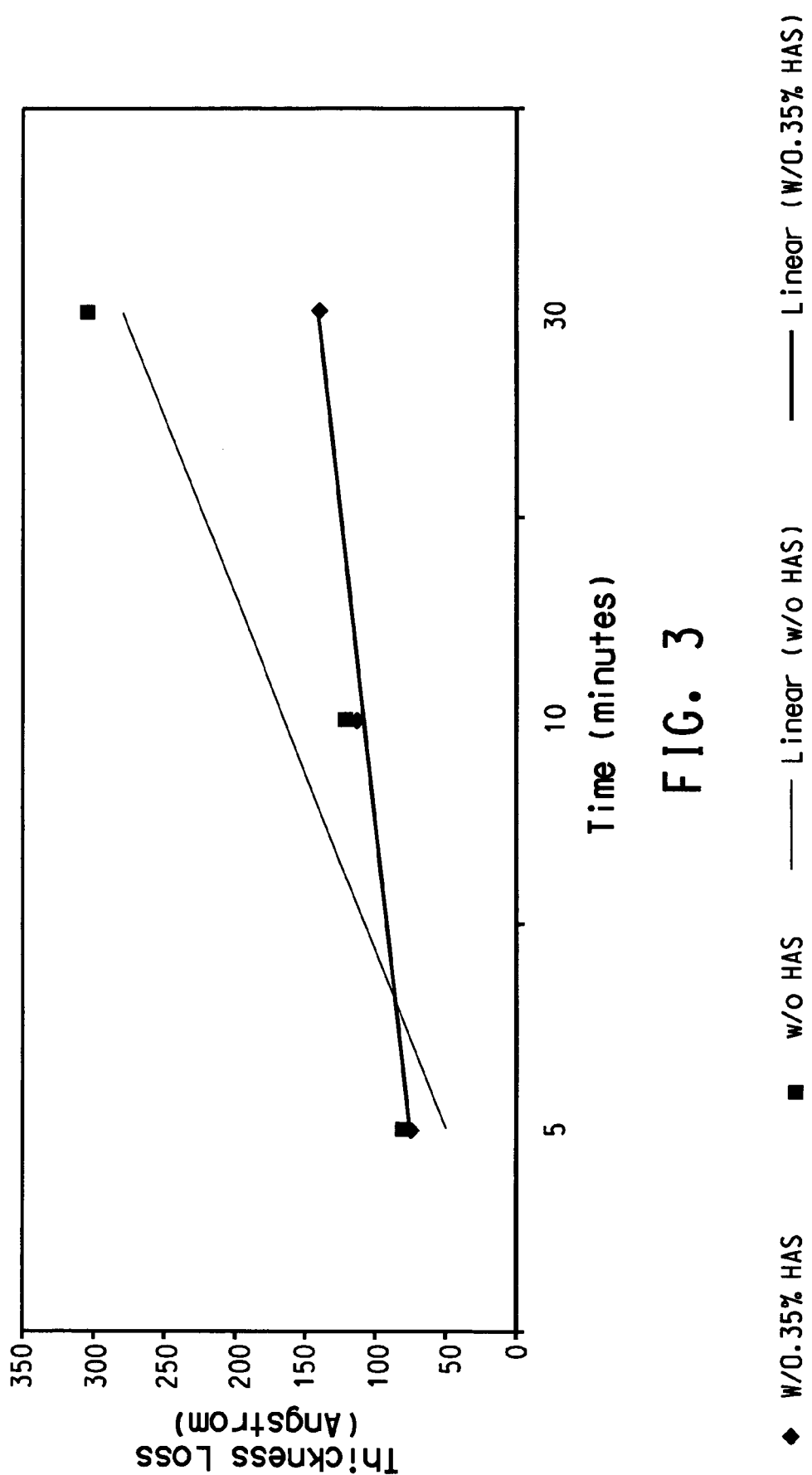
FIG. 3 is a plot of copper thickness loss (Angstroms) against exposure time at 35° C. for Solution B5 versus a comparable solution without HAS.

The addition of hydroxylamine or its salts to choline solutions substantially lowers the copper etch rate. For example, as shown in Table 3 and FIG. 3, solution B5 with 0.35% hydroxylamine sulfate (HAS) lost less than half the Cu thickness estimated for a comparable solution without HAS based on extrapolated data from FIG. 2.

TABLE 9

Cu thickness loss (Angstroms) versus time for Solution B5

| Time (Min) | Solution B5-Cu thickness loss (Angstroms) | Data extrapolated from FIG. 5 |
|---|---|---|
| 2 | 48 | 38 |
| 5 | 71 | 75 |
| 10 | 111 | 119 |
| 30 | 141 | 305 |

Similar reduction of copper etch was also observed with the addition of up to 20% of hydroxylamine freebase (50% solution) to the choline hydroxide solutions. Table 4 illustrates the reduction of copper loss by adding 5% hydroxylamine freebase to various concentrations of choline solutions (Solutions B7 to B9). In these examples, the reduction of copper thickness lost is about 50%.

TABLE 10

Cu thickness loss (Angstroms) for Solutions B6-B9

| Solution | Cu thickness loss after 30 minutes in solution @ 35° C. |
|---|---|
| B6 | 310 |
| B7 | 155 |
| B8 | 156 |
| B9 | 171 |

Dry-Film Photoresist Preparation and Stripping on WLP Wafers

WB1000, WB2000, WB3000, and WB5000 are dry film photoresists produced by DuPont for use in forming WLP solder bumps on wafers. Table 11 summarizes the processing parameters used on these four types of photoresist prior to stripping the photoresist. This processing included: (1) laminating the photoresist, (2) baking, (3) exposing, (4) baking again, (5) developing, (6) baking again, (7) cleaning, (8) microetching, (9) plating copper, and (10) plating tin.

TABLE 11

Dry photoresist processing prior to stripping

| Product Name | WB 1000 | WB 2000 | WB 3000 | WB 5000 |
|---|---|---|---|---|
| Original Thickness | 4.0 mil | 2.0 mil | 4.0 mil | 2.0 mil |
| Number of Laminations | 1 | 2 | 1 | 2 |
| Lamination Temp | 95 C. | 95 C. | 95 C. | 95 C. |
| Lamination Speed | 1.2 m/min | 1.2 m/min | 1.2 m/min | 1.2 m/min |
| Oven Bake Temp | 65 C. | 65 C. | 65 C. | 65 C. |
| Oven Bake Dwell | 20 min | 20 min | 20 min | 20 min |
| Exposure Energy (mJ) Exposure Step Held (RST41) | 23 | 23 | 23 | 23 |
| Oven Bake Temp | 86 C. | 86 C. | 86 C. | 86 C. |
| Oven Bake Dwell | 25 min | 25 min | 25 min | 25 min |
| Development % BP | 55% | 55% | 55% | 55% |
| Development Temp | 28 C. | 28 C. | 28 C. | 28 C. |

TABLE 11-continued

Dry photoresist processing prior to stripping

| Product Name | WB 1000 | WB 2000 | WB 3000 | WB 5000 |
|---|---|---|---|---|
| Development Conc. % | 0.85% NaCO3 | 0.85% NaCO3 | 0.85% NaCO3 | 0.85% NaCO3 |
| Oven Bake Temp | 110 C. | 110 C. | 110 C. | 110 C. |
| Oven Bake Dwell | 10 min | 10 min | 10 min | 10 min |
| Pre-Plate Cleaning Microetch | | | | |
| Copper | 1.0 mil | 1.0 mil | 1.0 mil | 1.0 mil |
| Tin | 3.0 mil | 3.0 mil | 3.0 mil | 3.0 mil |

NBNP = No Reflow Bake and No Plating

TABLE 12

Dry photoresist stripping results for Solutions

| Solution | Temp (° C.) | Time (min) | Performance |
|---|---|---|---|
| A1 | 85 | 20 | Poor |
| A2 | 85 | 20 | Poor |
| A3 | 85 | 20 | Poor |
| A1 | 100 | 20 | Poor |
| A2 | 100 | 20 | Poor |
| A3 | 100 | 20 | Poor |
| A4 | 90 | 20 | Good |
| A5 | 90 | 20 | Poor |
| A6 | 55 | 20 | Good |
| A7 | 55 | 20 | Good |
| A8 | 55 | 20 | Excellent |
| A9 | 55 | 20 | Excellent |
| A10 | 55 | 20 | Excellent | poor = < 95% removal,
good = 95-98%, and
excellent => 98% removal.

Solutions A8-A10 perform the best to strip the resist and without attacking the metals. Solutions A6 and A7 also strips the resist but residue remains on the substrate surface. Solution A4 also demonstrates the capability to strip photoresist, however, it requires use at higher temperature and will attack the solder materials due to its acidity from dodecylbenzenesulfonic acid.

DuPont 9015 dry photoresist was also tested with solutions A8, A9, and A10. Table 13 describes exemplary processing for this photoresist prior to stripping.

TABLE 13

Processing for Dupont 9015 resist prior to stripping

| Copper | 1 oz copper substrate |
|---|---|
| Copper Pre Clean | Standard conditions - brush scrub (option 1) |
| | Standard conditions - Microtech |
| | (Acid clean and 30 microinches) |
| | (option 2) |
| Lamination | Dry - HRL |
| | Speed - 1.2 m/min (processing speed) |
| | Pressure - none |
| | Temperature - 105 C. |
| Lamination Time | Hold panels for 30 min prior to exposure/development |
| Exposure | Photomask type = PC530 Mylar/Glass |
| | High intensity exposure |
| | Energy mJoules (see below) |
| | Vacuum Delay 30 sec |
| | Design - Blank exposure |
| Development | Standard conditions - 55% BP |
| Optional Bake | Temperature 80 C. |
| | Dwell Time 30 min |

TABLE 13-continued

Processing for Dupont 9015 resist prior to stripping

| | |
|---|---|
| Pre Plate Clean | NA |
| Copper Plating | NA |
| Tin Plating | NA |

TABLE 14

Additional processing for DuPont 9015 resist prior to stripping

| Panel | Copper Treatment | Exposure (milliJoules) | Bake |
|---|---|---|---|
| A | Brush | 100 | Yes |
| B | Brush | 100 | No |
| C | Brush | 150 | Yes |
| D | Brush | 150 | No |
| E | Brush | 200 | Yes |
| F | Brush | 200 | No |
| G | Microtech | 100 | Yes |
| H | Microtech | 100 | No |
| I | Microtech | 150 | Yes |
| J | Microtech | 150 | No |
| K | Microtech | 200 | Yes |
| L | Microtech | 200 | No |

Solutions A8, A9 and A10 effectively removed all the dry film 9015 sample panel A to L at 55° C. in less than 5 minutes at 45° C.

Dry-Film Photoresist and Flux Removal From Solder-Bumped PCBs and Solder-Bumped Wafers PCB and wafer test samples were cleaved into pieces approximately 1 inch squares (1 in²). About 300 ml of solutions C1-C8 was poured into 600 ml glass beakers and placed on temperature-controlled hotplates. Samples were treated at about 35-60° C. for about 5-30 minutes.

| Temp (° C.) | Time (min) | DI Rinse Cycles |
|---|---|---|
| 35-60 | 5-30 | 5 |

A small amount of agitation was manually applied during the cleaning process. All samples were directly rinsed in a beaker of non-CO₂-sparged deionized (DI) water and a running stream of DI water, where the beaker was emptied and filled five times. After rinsing, each sample was dried with a pressurized stream of nitrogen. Lastly, each sample was inspected with an optical microscope followed by inspection with a scanning electron microscope (SEM).

TABLE 15

Dry Film and Flux Removal Results

| Group | Cleaning Results |
|---|---|
| C1 | Clean, no photoresist or flux |
| C2 | Clean, no photoresist or flux |
| C3 | Clean, no photoresist or flux |
| C4 | Clean, no photoresist or flux |
| C5 | Clean, no photoresist or flux |
| C6 | Clean, no photoresist or flux |
| C7 | Clean, no photoresist or flux |
| C8 | Clean, no photoresist or flux |

Figure 4A:
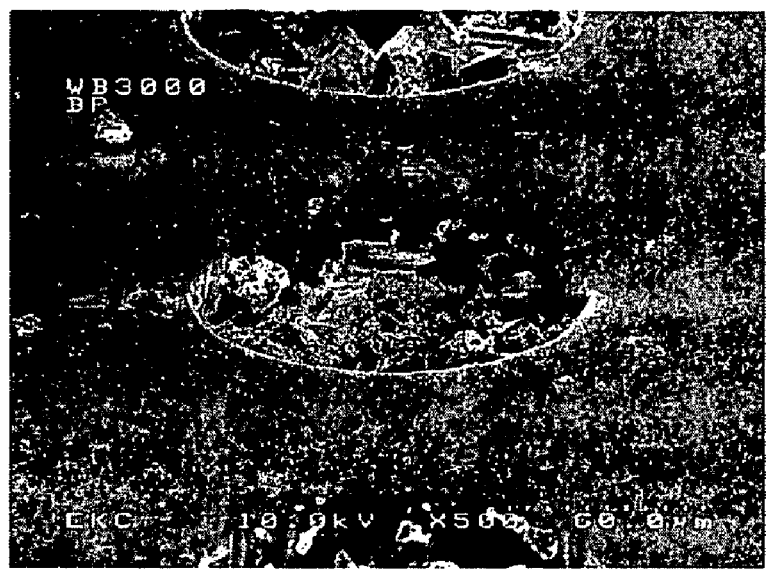
FIGS. 4A-4B are SEMs of a contact before and after stripping.
Figure 4B:
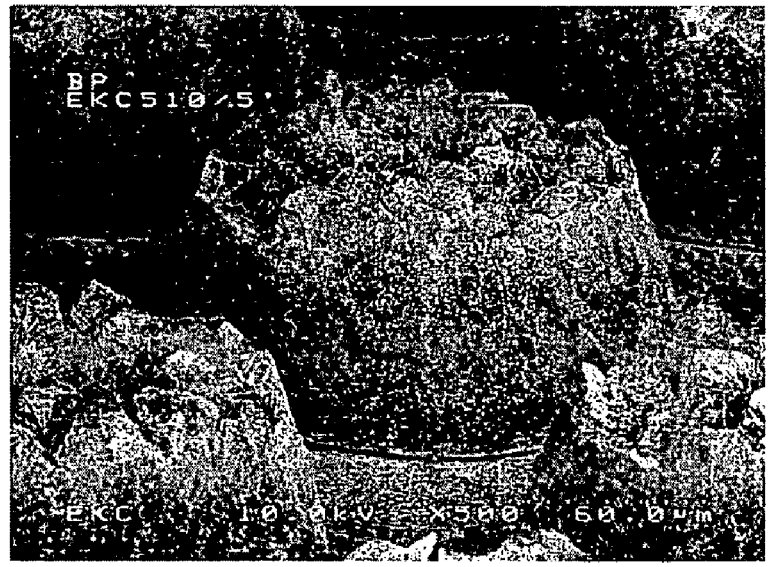
Figure 5A:
FIGS. 5A-5D are SEMs of solder bumps before and after stripping.
Figure 5B:
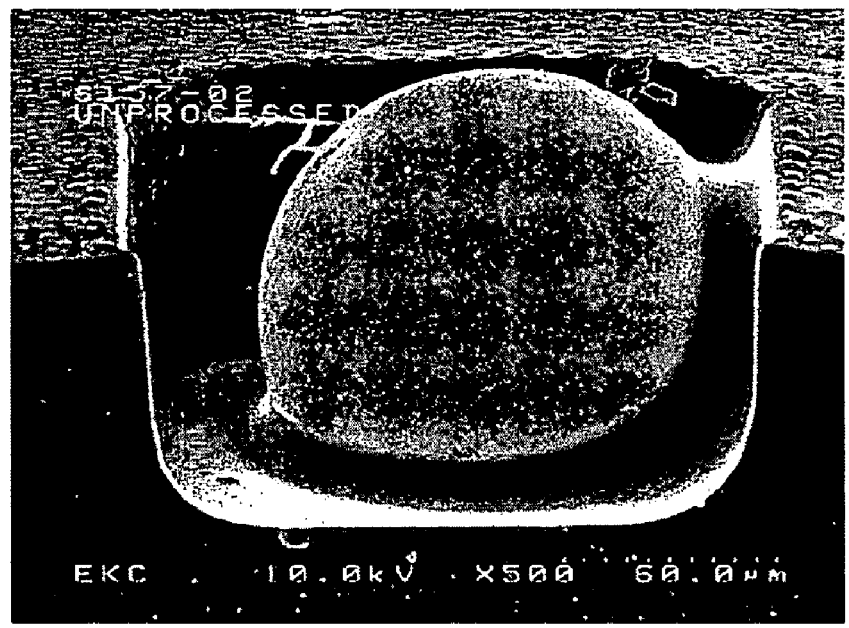
Figure 5C:
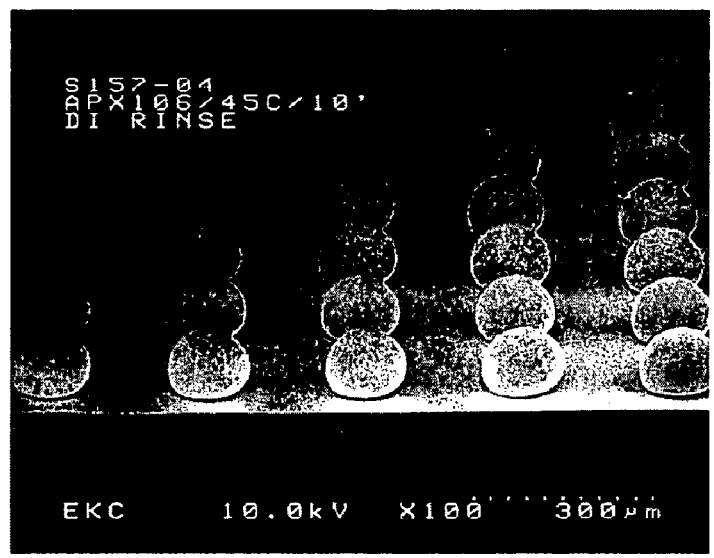
Figure 5D:
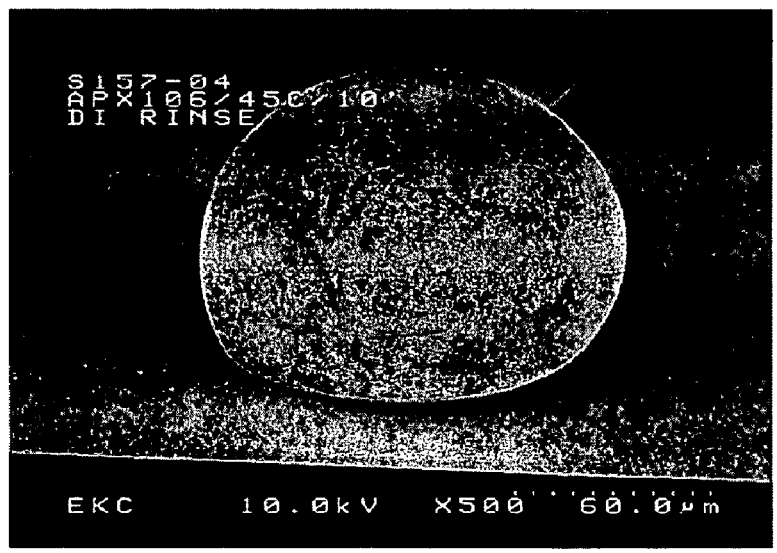
Figure 6A:
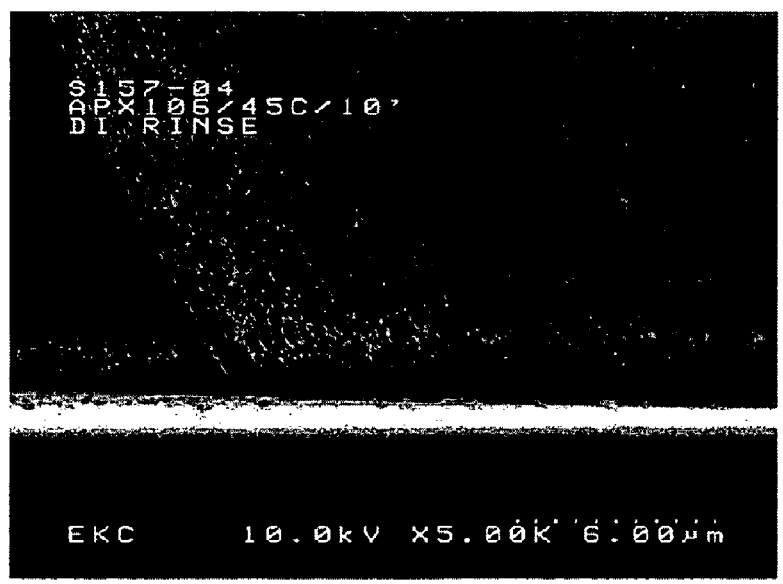
FIGS. 6A-6D shows magnifications of solder bumps after rinse.
Figure 6B:
Figure 6C:
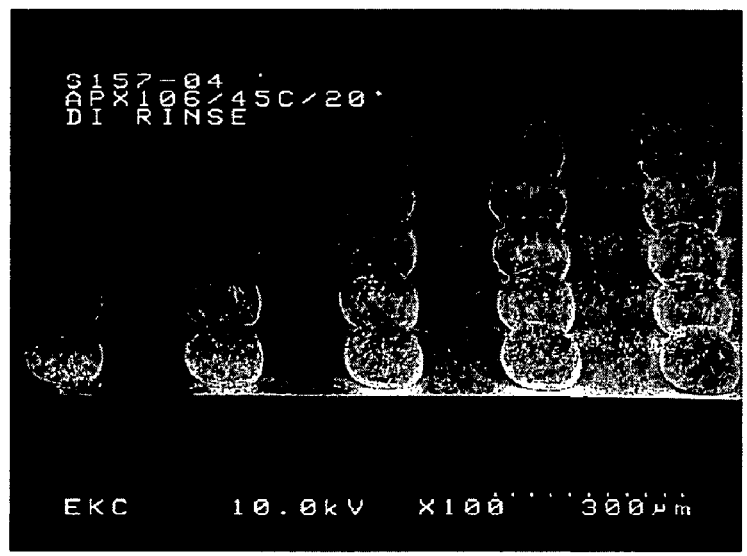
Figure 6D:
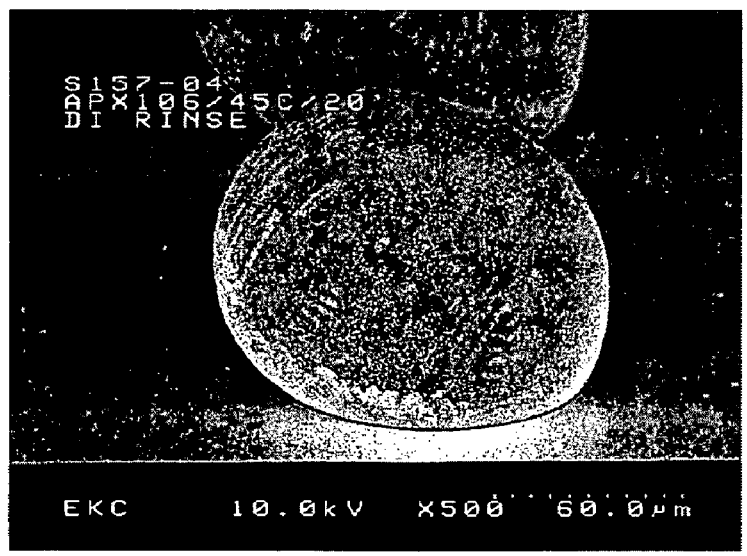
Figure 7A:
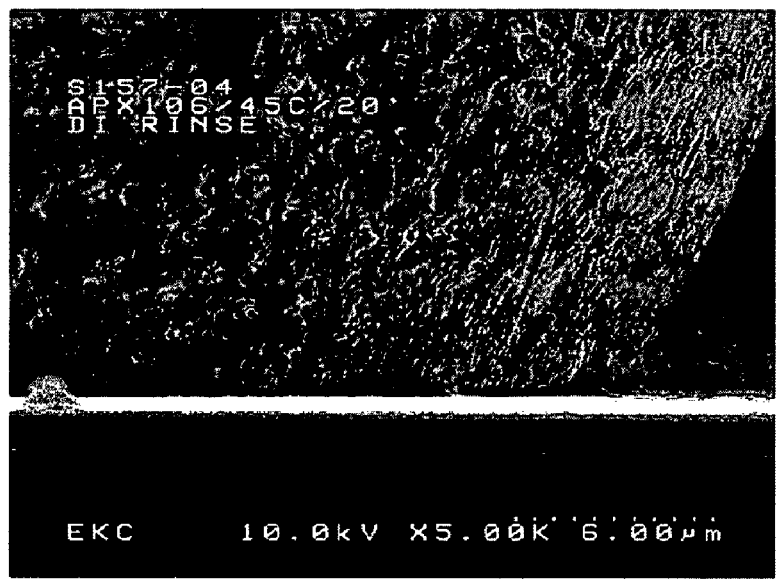
FIGS. 7A-7D shows magnifications of solder bumps after rinse.
Figure 7B:
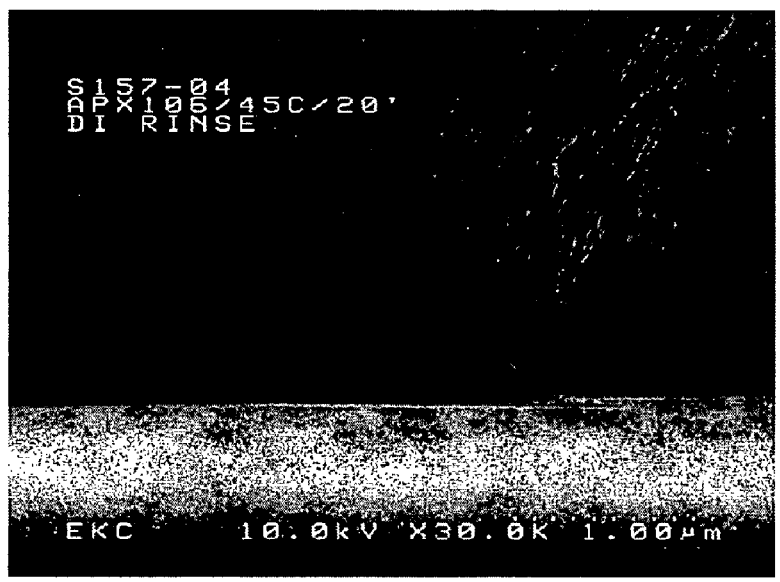
Figure 7C:
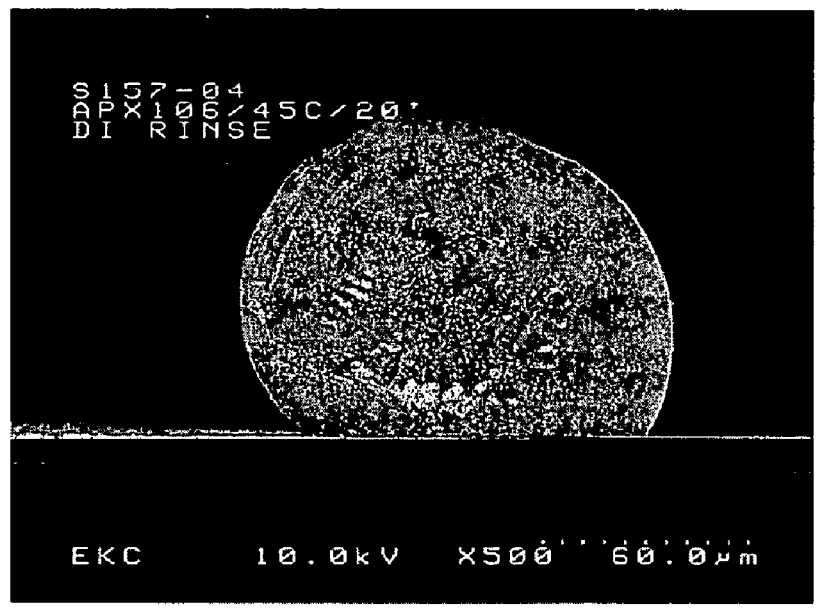
Figure 7D:
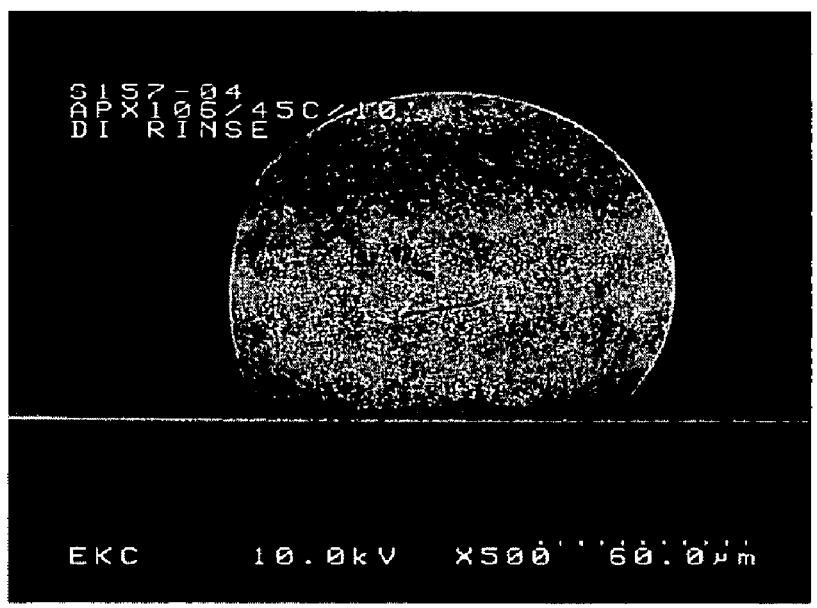

FIGS. 4A and 4B are exemplary SEM images of PCB before and after photoresist stripping with solution C6 at 45° C. for 5 minutes, respectively. FIGS. 5A-5D, 6A-6D, and 7A-7D are exemplary SEM images of WLP wafers before and after photoresist stripping with solution C1 at 45° C. for 10-20 minutes. For both PCB and WLP substrates, the dry film photoresist was easily removed by immersion cleaning with solutions C1-C8. The dry film quickly swelled, broke apart, and fell to the bottom of the beaker, even without any agitation being applied to the samples.

These PCB and WLP stripping processes provide short process times at low process temperatures. This process is compatible with copper and the solder bumps. There is little or no roughening of the metal surfaces.

Spin-On Photoresist and Flux Removal From Solder-Bumped Wafers

Figure 9A:
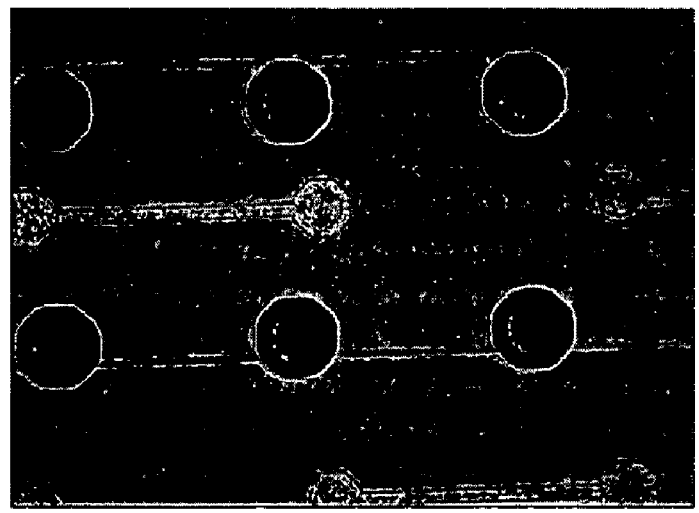
FIGS. 9A-9G are SEMs showing stripping results.
Figure 9B:
Figure 9C:
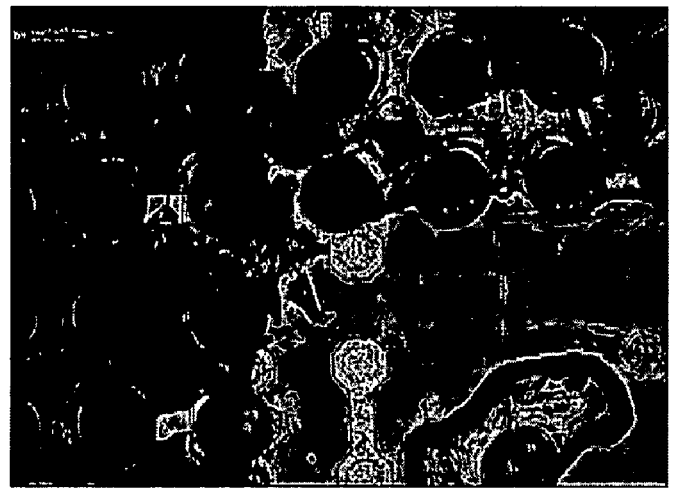
Figure 9D:
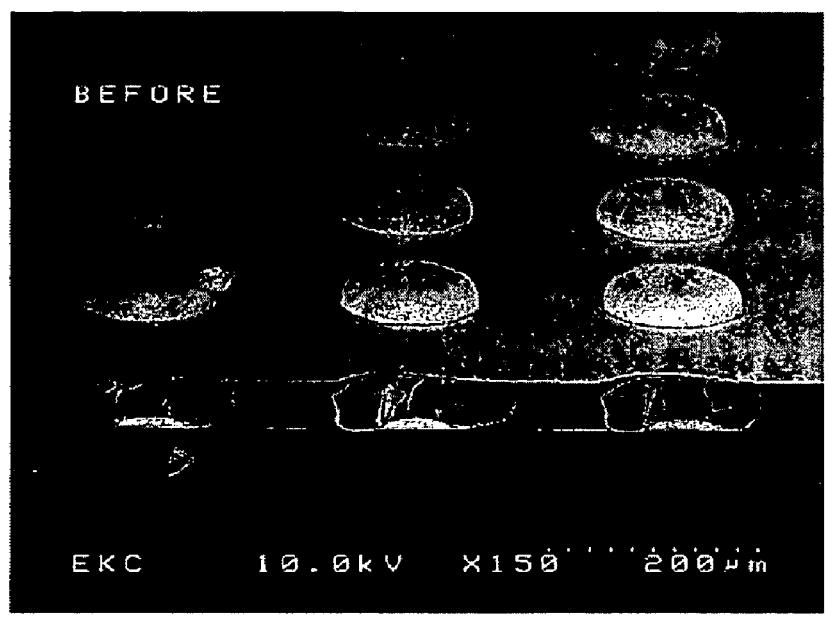
Figure 9E:
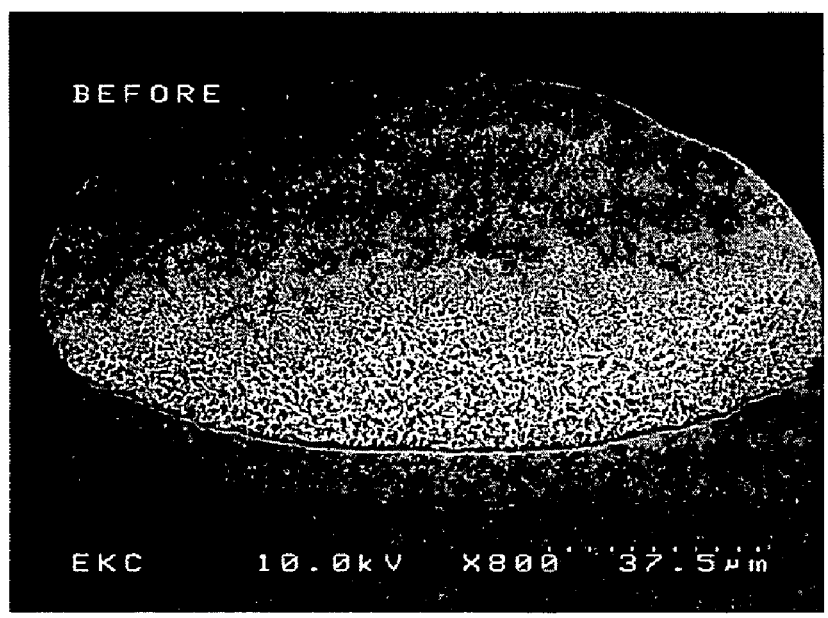
Figure 9F:
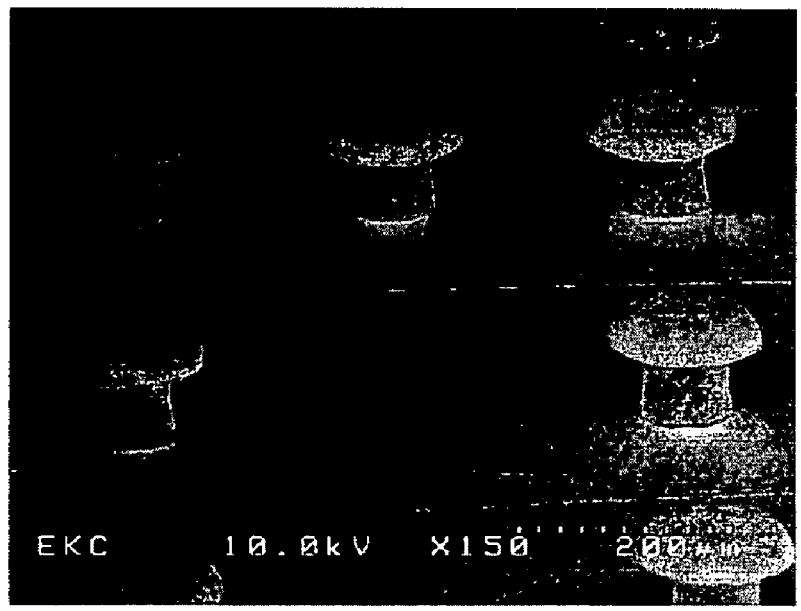
Figure 9G:
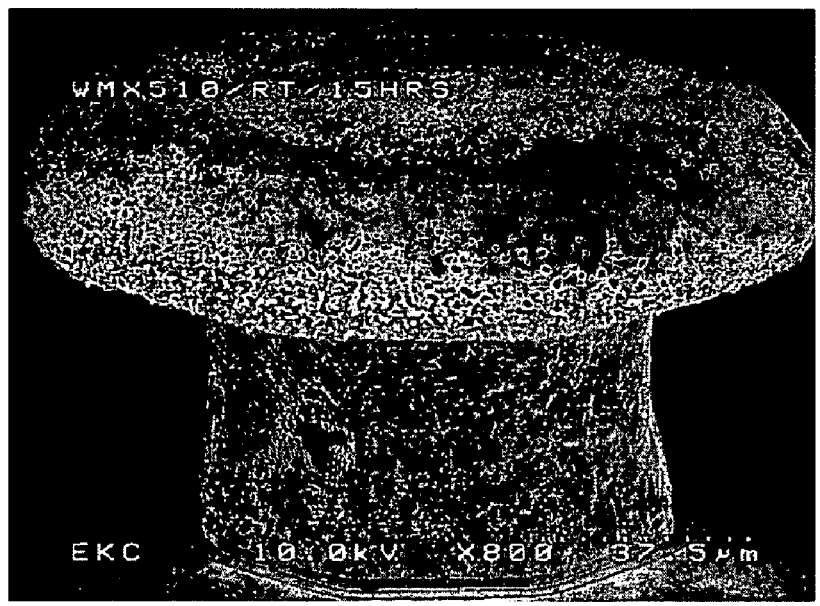
Figure 10A:
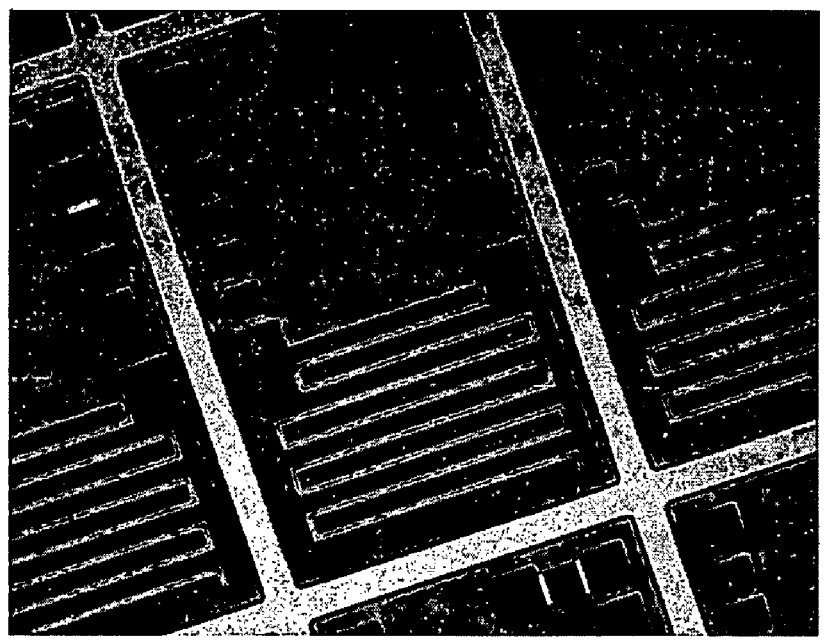
FIGS. 10A-10R are SEMs showing stripping results.
Figure 10B:
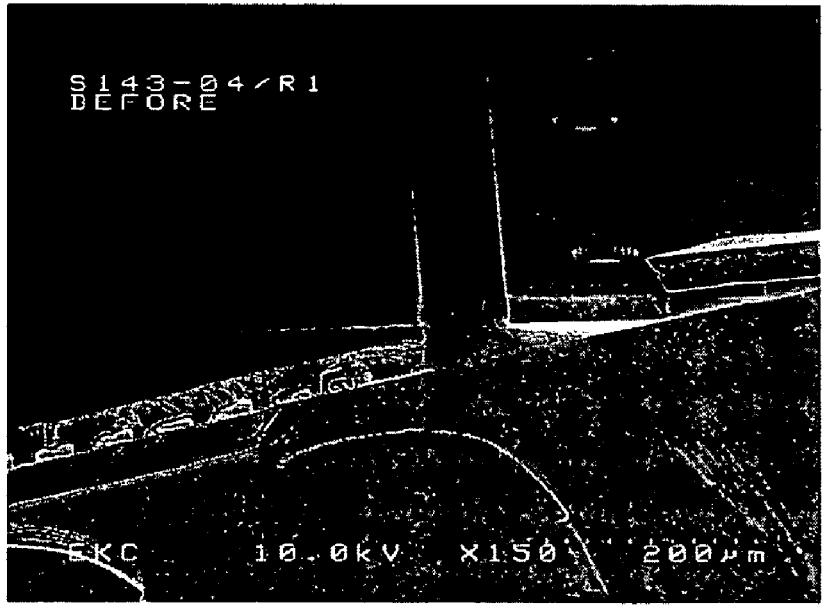
Figure 10C:
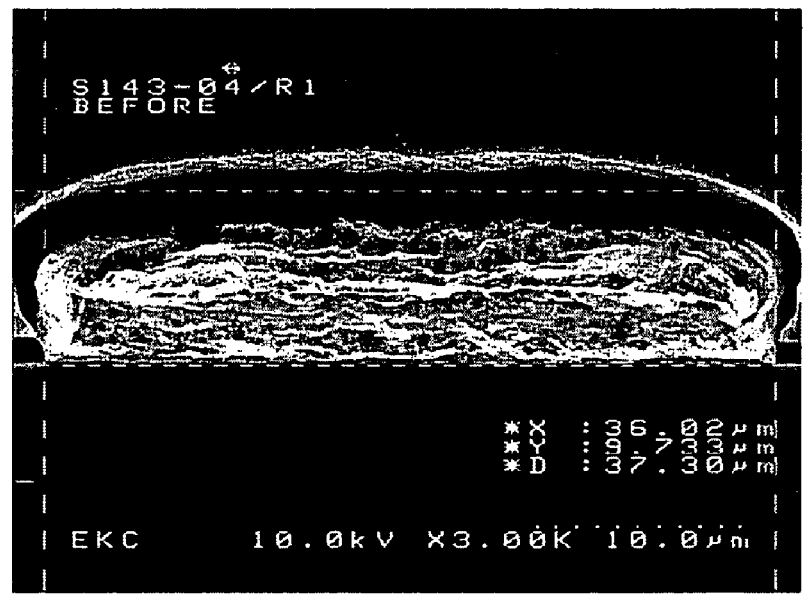
Figure 10D:
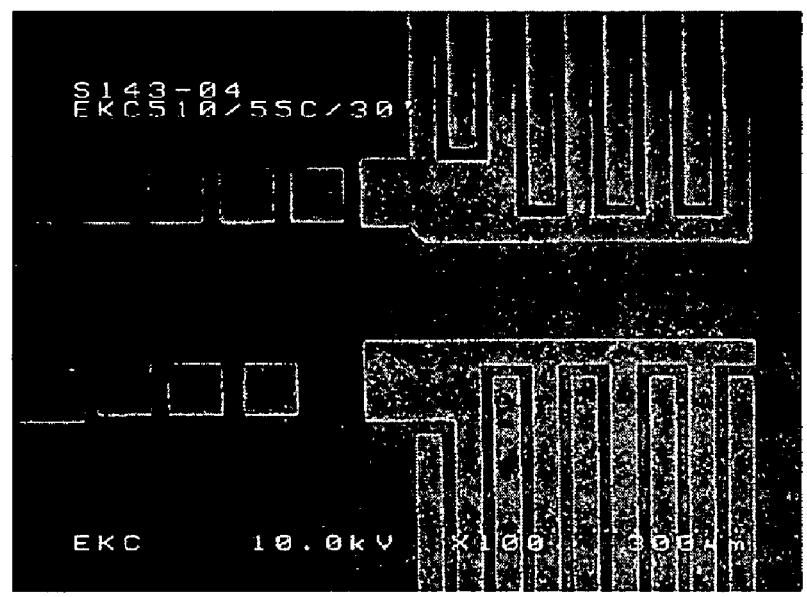
Figure 10E:
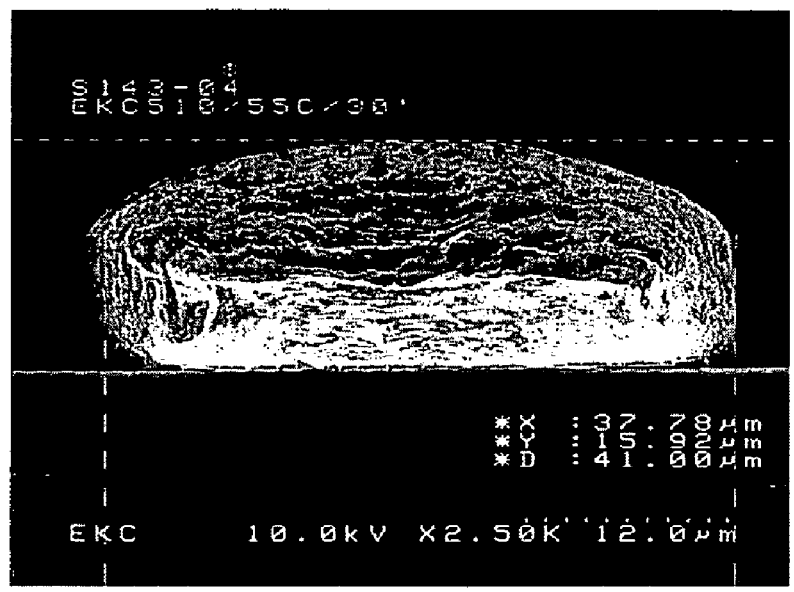
Figure 10F:
Figure 10G:
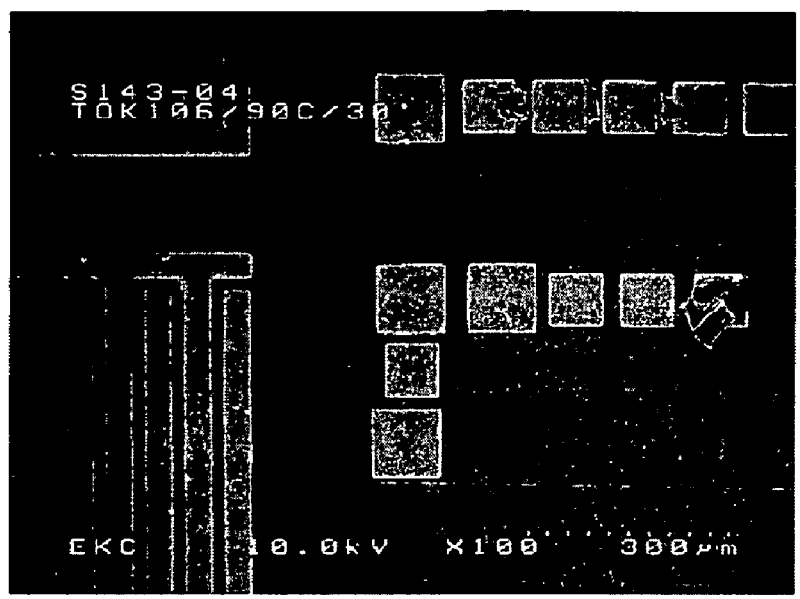
Figure 10H:
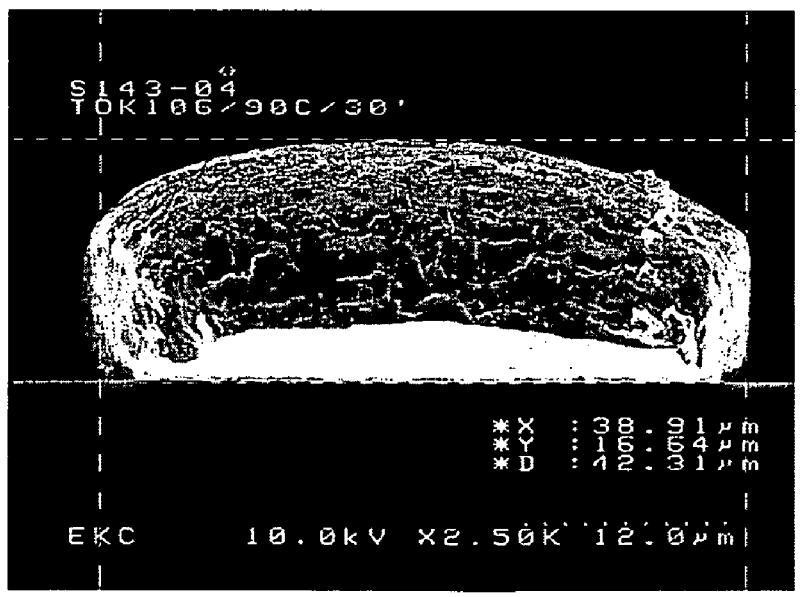
Figure 10I:
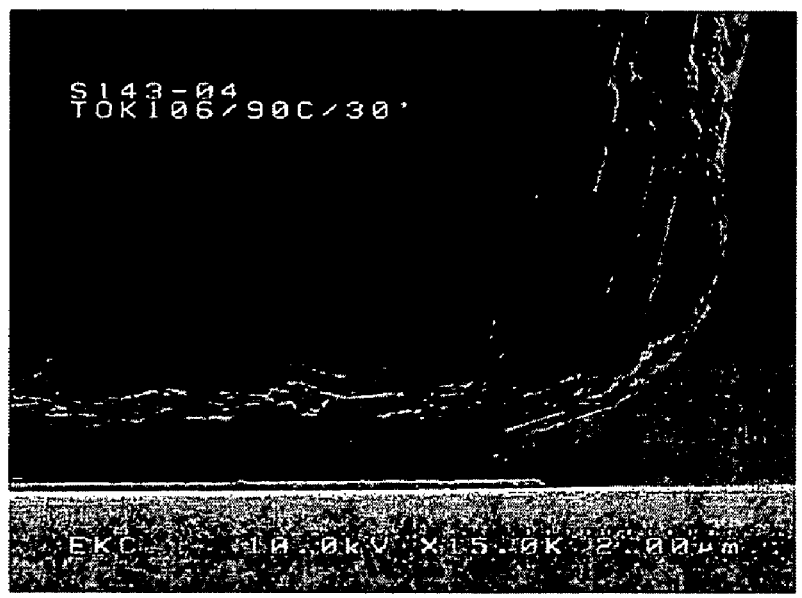
Figure 10J:
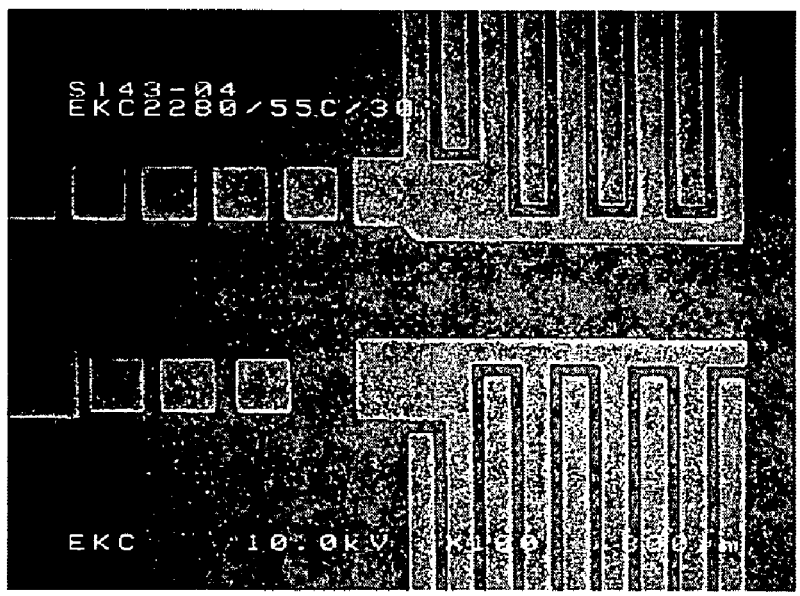
Figure 10K:
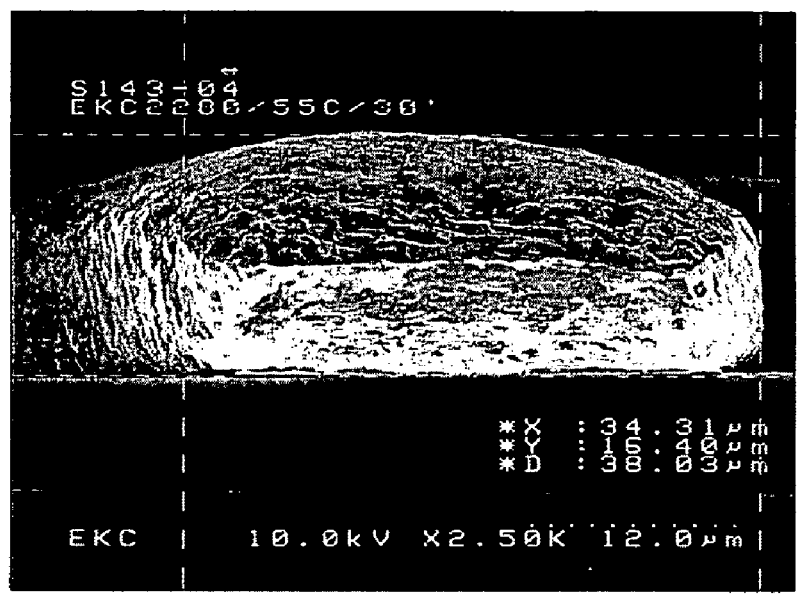
Figure 10L:
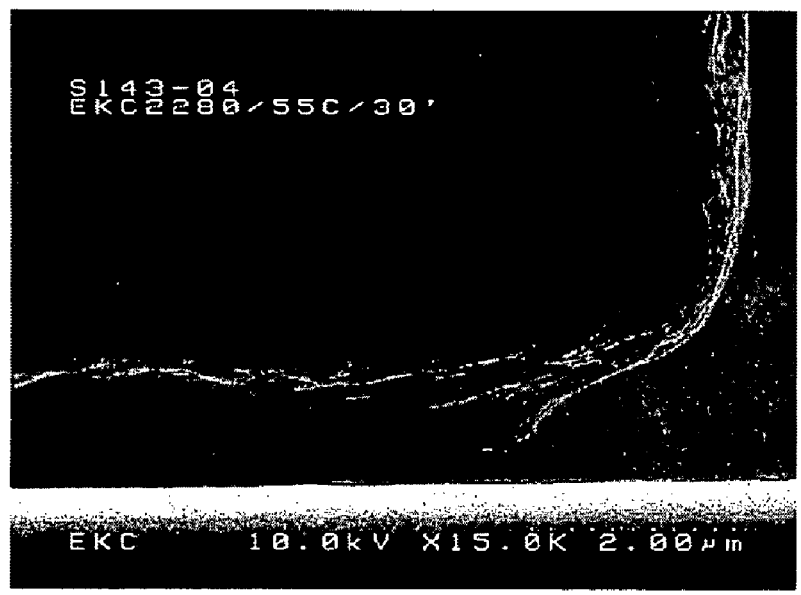
Figure 10M:
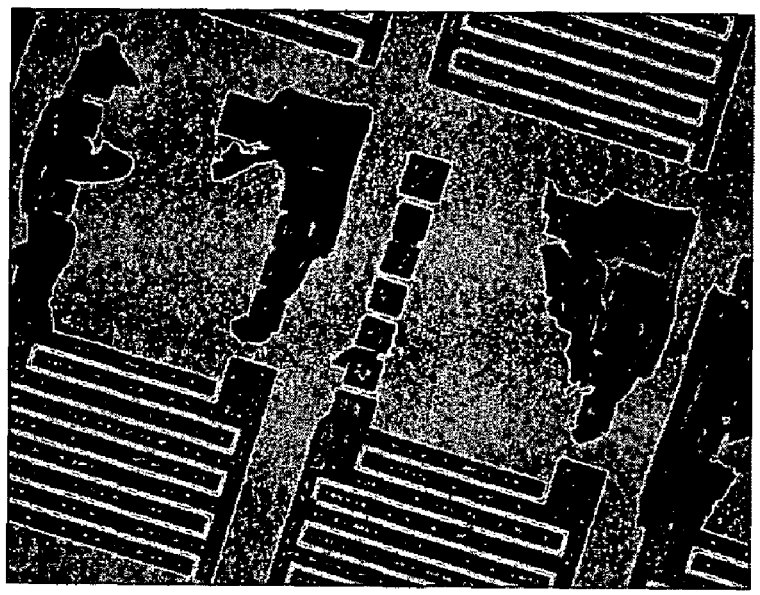
Figure 10N:
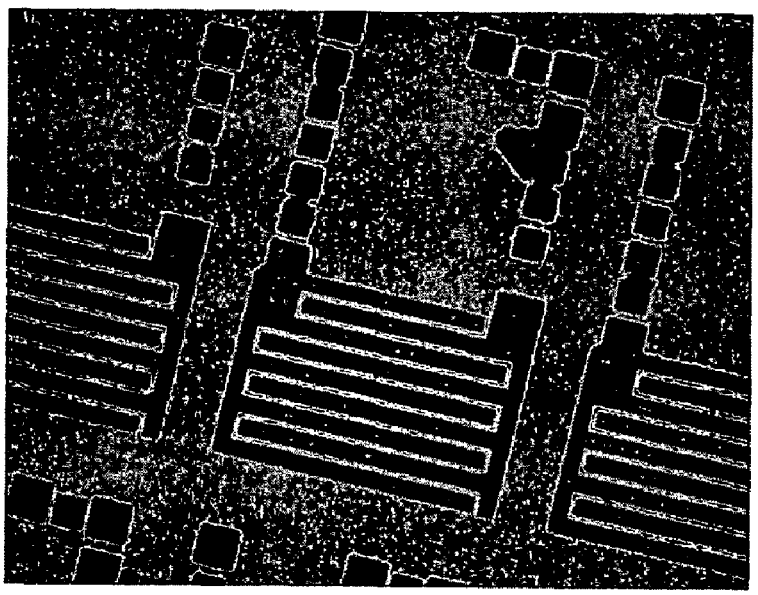
Figure 10O:
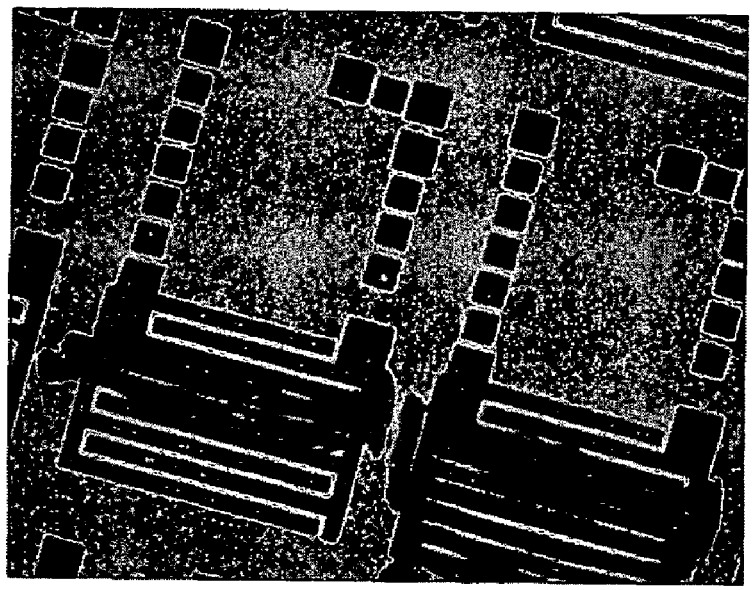
Figure 10P:
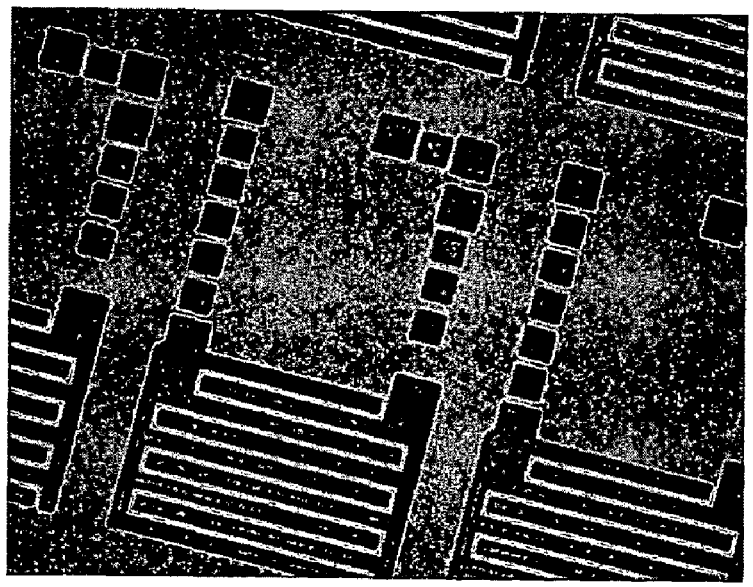
Figure 10Q:
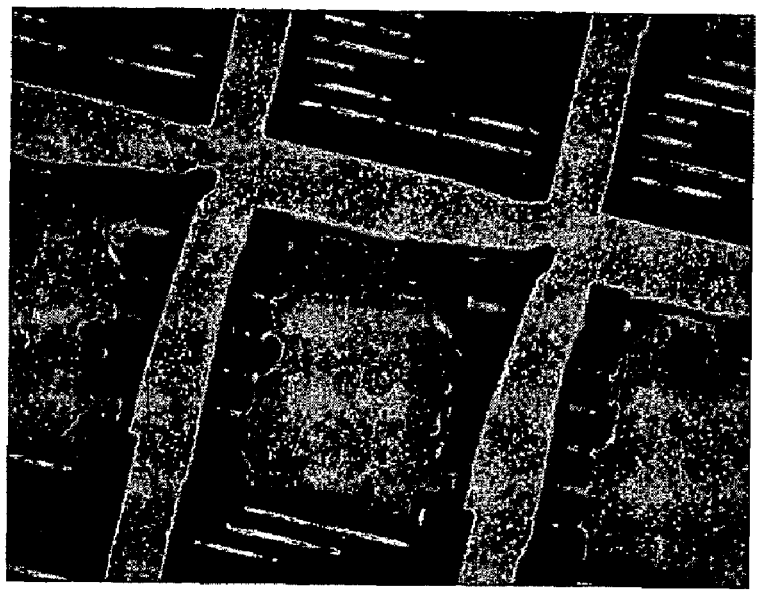
Figure 10R:
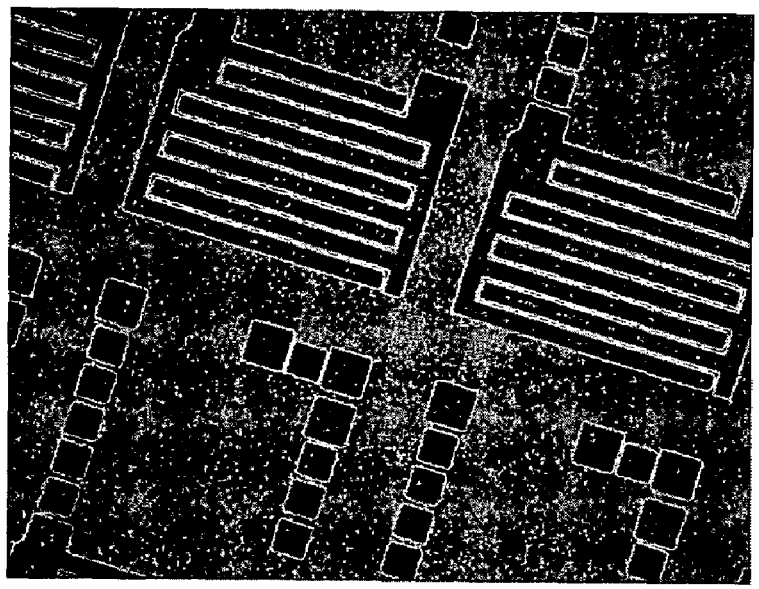

A seed metallurgy consisting of 100 nm Cu over 200 nm TiW was deposited on a silicon wafer substrate. 50 microns of JSR THB-151 N photoresist (with no wetting agent) was spun on top of the seed metallurgy. The coated wafer was then softbaked at 120° C. for 300 sec. The resist was exposed and the unexposed resist removed with a 2.38% TMAH developer solution. A thin layer of Ni was electro-plated over the resist patterns and lead-free solder materials consisting of Sn/Ag was deposited by electroplating to create the solder bumps shown in FIGS. 9D-9E.

The wafer was broken into samples approximately 3 cm² and processed in a temperature-controlled beaker under a fume hood. The processing conditions and results for solutions D2-D12 are summarized in Table 16 and FIGS. 9A-9C and 9F-9G. The photoresist was completely removed by solutions D8-D12.

TABLE 16

Spin-on Resist Stripping Process Conditions and Results

| Stripping Solution | T (° C.) | Time (min) | Rinse Solution | T (° C.) | Time (min) | Results |
|---|---|---|---|---|---|---|
| D2 | 65 | 15 | NONE | RT | 5 | Incomplete strip |
| D3 | 65 | 15 | NONE | RT | 5 | Incomplete strip |
| D6 | 75 | 30 | D13 | RT | 5 | Incomplete strip |
| D8 | 50 | 15 | NONE | RT | 5 | Resist completely removed |
| D9 | 50 | 15 | NONE | RT | 5 | Resist completely removed |
| D10 | 50 | 15 | NONE | RT | 5 | Resist completely removed |
| D11 | 50 | 15 | NONE | RT | 5 | Resist completely removed |
| D12 | 50 | 15 | NONE | RT | 5 | Resist completely removed |

Post Etch Residue Removal

A wafer was cleaved into samples approximately 1-inch square and the samples were then processed individually. Solutions E1-E15 were heated in 200 ml Pyrex beakers with magnetic stirrers on temperature-controlled hot plates at the process conditions listed in Table 17. Each sample was processed in one of these solutions. The samples were then rinsed with 3-cycle DI water and blown dry with nitrogen. SEM images were obtained to evaluate the cleaning ability of each composition and process. The results are summarized in FIGS. 8A-8N. Solution mixtures with various ratios of choline hydroxide and hydroxylamine perform the best in removing the etch residue without attacking the metal. Hydroxylamine solution alone cannot remove the etch residue completely.

TABLE 17

Post etch residue removal

Figure 8A:
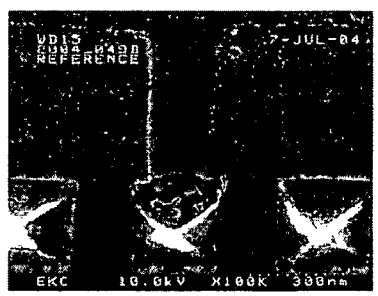
FIGS. 8A-8N are SEMs showing stripping results.
Figure 8B:
Figure 8C:
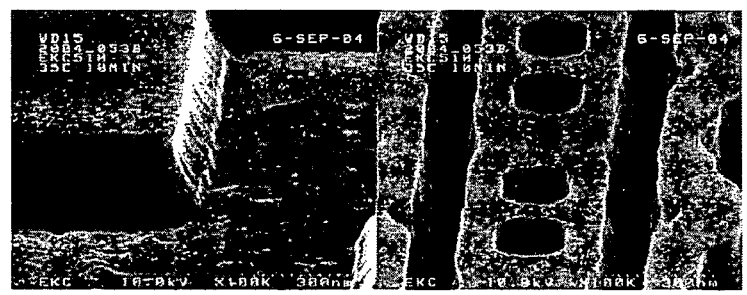
Figure 8D:
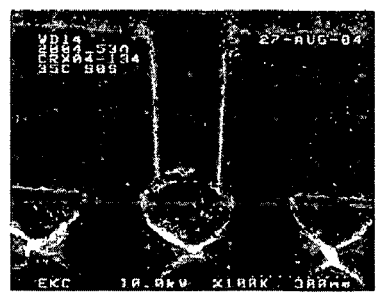
Figure 8E:
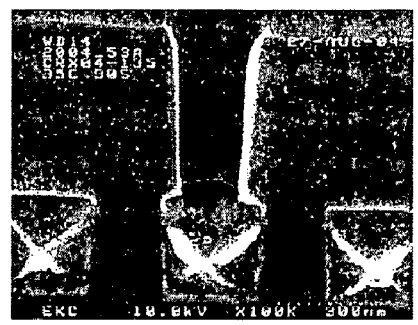
Figure 8F:
Figure 8G:
Figure 8H:
Figure 8I:
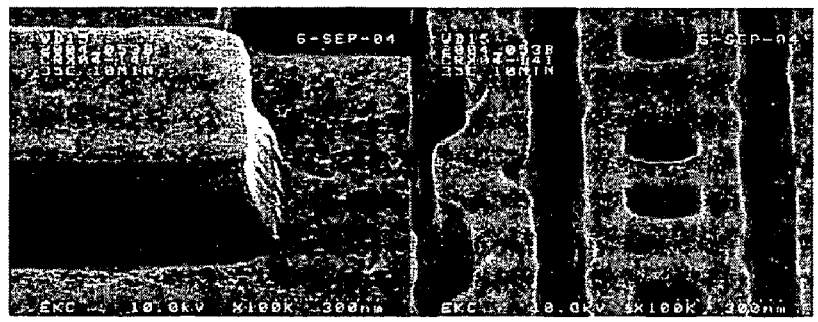
Figure 8J:
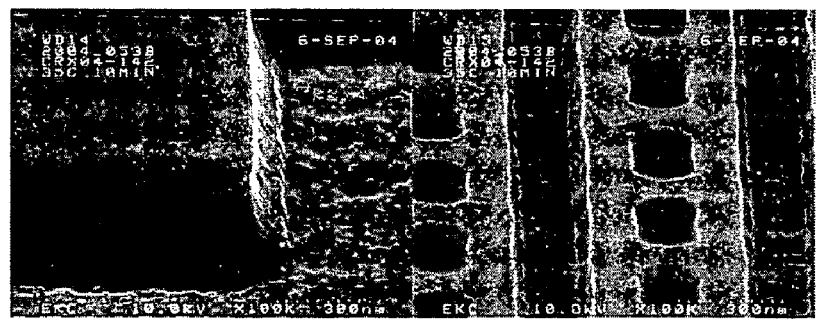
Figure 8K:
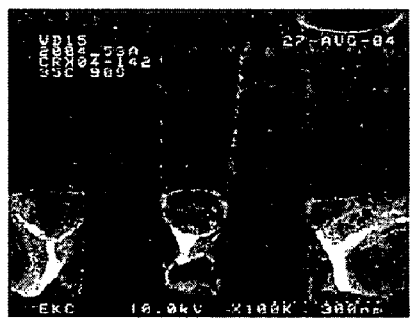
Figure 8L:
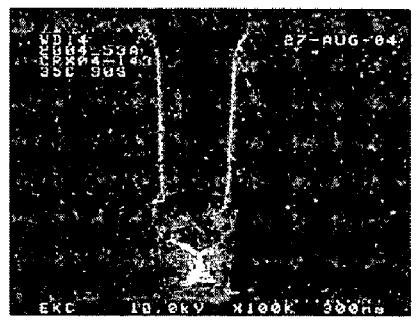
Figure 8M:
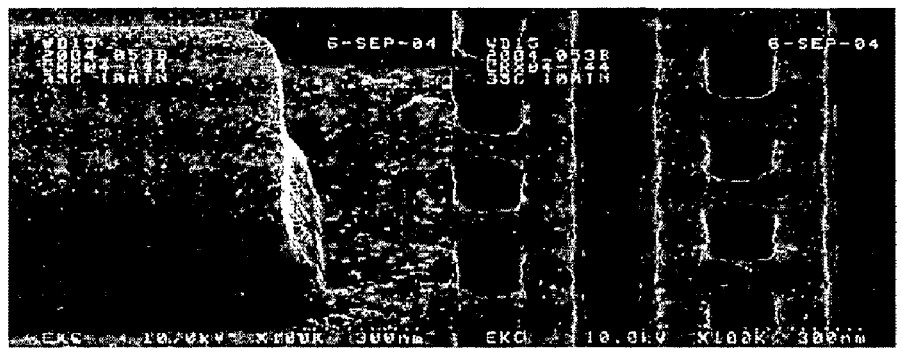
Figure 8N:
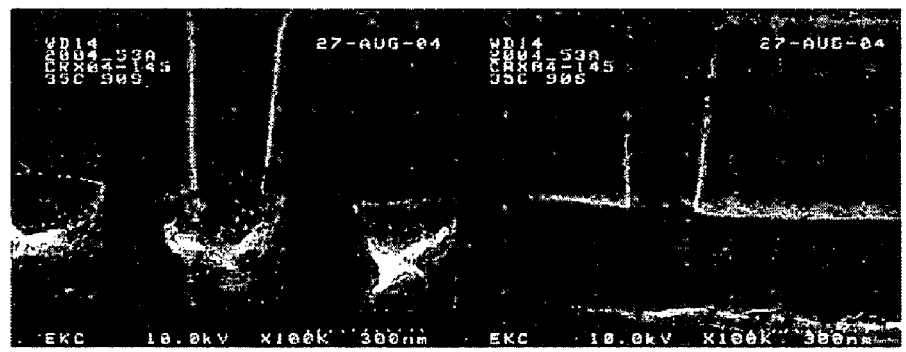

| | | | |
|---|---|---|---|
| Reference (Before Picture) | None | FIG. 8A | Control |
| Reference (Before Picture) | None | FIG. 8B | Control |
| E1 | 35° C. 10 min | FIG. 8C | CLEAN COMPLETELY |
| E4 | 35° C. 90 s | FIG. 8D | Clean without attacking the copper line |
| E5 | 35° C. 90 s | FIG. 8E | Clean without attacking the copper line |
| E7 | 35° C. 90 s | FIG. 8F | Clean without attacking the copper line |
| E9 | 35° C. 90 s | FIG. 8G | Clean without attacking the copper line |
| E10 | 35° C. 90 s | FIG. 8H | Clean without attacking the copper line |
| E11 | 35° C. 10 min | FIG. 8I | CLEAN COMPLETELY |
| E12 | 35° C. 10 min | FIG. 8J | CLEAN COMPLETELY |
| E12 | 35° C. 90 s | FIG. 8K | Clean without attacking the copper line |
| E13 | 35° C. 90 s | FIG. 8L | Clean without attacking the copper line |
| E14 | 35° C. 10 min | FIG. 8M | CLEAN COMPLETELY |
| E15 | 35° C. 90 s | FIG. 8N | Clean without attacking the copper line |

Removal of Uncured Photoresist from Cu Patterned Wafers 15-micron-thick copper lines were patterned on wafers. 30-micron-thick polyimide photoresist (HD 4010 photoresist from HD Microsystem) was patterned on top of the copper lines, but the photoresist was not cured.

A wafer was cleaved into samples approximately 1-inch square. The samples were processed individually in chemistries that were heated in 200 ml Pyrex beakers with magnetic stirrers on temperature-controlled hot plates. Table 18 lists the process conditions and results for solutions F1-F6 in Table 5. The sample processed in F2 was rinsed in isopropyl alcohol (IPA) before being rinsed in DI water. For the rest of the samples, after immersion in one of the solutions, the samples were rinsed with 3-cycle DI water and blown dry with nitrogen. To evaluate cleaning ability, the samples were inspected by optical microscope. SEM inspection was then performed on the samples that showed "Fair" to "Good" cleaning efficiency and solubility; see FIG. 10M-10R.

TABLE 18

Uncured photoresist removal processing conditions and results

| Solution | Temp (° C.) | Time (minutes) | Cleaning Performance | Residue Solubility |
|---|---|---|---|---|
| F1 | 70 | 10 | Poor | |
|  | 90 | 30 | Fair | Poor |
| F2 | 70 | 10 | Bad | |
|  | 90 | 30 | Bad | |
| F3 | 55 | 10 | Poor | |
|  | 55 | 30 | Good | Bad |
| F4 | 55 | 10 | Bad | |
|  | 55 | 30 | Good | Good |
| F5 | 55 | 10 | Poor | |
|  | 55 | 30 | Good | Good |
| F6 | 70 | 10 | Poor | |
|  | 90 | 30 | Fair | Fair |

*Bad - Majority of polyimide adheres after processing
*Poor - Some polyimide adheres and some is removed
*Fair - Small amounts of polyimide still present in some areas on the sample
*Good - No remaining polyimide observed on sample The most effective processes were solution F4, for 30 minutes at 55° C. and solution F5, for 30 minutes at 55° C. These two solutions dissolved the residue and cleaned the substrate. SEM images showed some surface change in the copper exposed during processing (i.e., exposed by pre-formed openings in the photoresist) for F4, but no change for F5. Thus, solution F5 was the most preferred composition.

Removal of Photoresist from Wafer-Level Packaging

Compositions W1-W30 were evaluated for their ability to remove DuPont WB3000 dry film photoresists from WLP substrates, after exposure at 55° C. for 10 minutes, as shown below in Table 19.

TABLE 19

Photoresist Removal from Wafer-Level Packaging
Process condition: 55° C./10 minutes

| Comp. | HDA (100%) | HAS | DEHA | COH (100%) | Water | DMSO/other | pH | Resist Strip of WB3000 Not baked, plated |
|---|---|---|---|---|---|---|---|---|
| W1 | 20 | | | 11.25 | 68.75 | | >12 | ☐ Complete remove |
| W2 | 10 | | | 11.25 | 78.75 | | >12 | ☐ Complete remove |
| W3 | | 20 | | 11.25 | 68.75 | | <7 | ☐ Not remove |
| W4 | | 10 | | 11.25 | 78.75 | | <7 | ☐ Not remove |
| W5 | | 2.5 | | 11.25 | 86.25 | | >12 | ☐ Complete remove |
| W6 | | 0.5 | | 11.25 | 88.25 | | >12 | ☐ Complete remove |
| W7 | | | 20 | 11.25 | 68.75 | | >12 | ☐ Complete remove |
| W8 | | | 10 | 11.25 | 78.75 | | >12 | ☐ Complete remove |

TABLE 19-continued

Photoresist Removal from Wafer-Level Packaging
Process condition: 55° C./10 minutes

| Comp. | HDA (100%) | HAS | DEHA | COH (100%) | Water | DMSO/ other | pH | Resist Strip of WB3000 Not baked, plated |
|---|---|---|---|---|---|---|---|---|
| W9 | | | 2.5 | 11.25 | 86.25 | | >12 | ☐ Complete remove |
| W10 | | | 0.5 | 11.25 | 88.25 | | >12 | ☐ Complete remove |
| W11 | | 20 | | 1 | 79 | | <7 | ☐ Not remove |
| W12 | | 10 | | 1 | 89 | | <7 | ☐ Not remove |
| W13 | | 2.5 | | 1 | 96.5 | | <7 | ☐ Not remove |
| W14 | | 0.5 | | 1 | 98.5 | | <7 | ☐ Not remove |
| W15 | 2.5 | | | 4.5 | 8 | 85 | 7 <> 12 | ☐ Partial remove |
| W16 | 2.5 | | | 11.25 | 16.25 | 70 | >12 | ☐ Complete remove |
| W17 | 2.5 | | | 11.25 | 36.25 | 50 | >12 | ☐ Complete remove |
| W18 | 2.5 | | | 11.25 | 56.25 | 30 | >12 | ☐ Complete remove |
| W19 | 2.5 | | | 11.25 | 71.25 | 15 | >12 | ☐ Complete remove |
| W20 | 10 | | | 2.25 | 77.75 | 10 sorbitol | 7 <> 12 | ☐ Partial remove |
| W21 | 2.5 | | | 15 | 82.5 | | >12 | ☐ Complete remove |
| W22 | 2.5 | | | 20 | 77.5 | | >12 | ☐ Complete remove |
| W23 | 2.5 | | | 25 | 72.5 | | >12 | ☐ Complete remove |
| W24 | 2.5 | | | 1 CCl | 96.5 | | <7 | ☐ Not remove |
| W25 | 2.5 | | | 10 CCl | 87.5 | | <7 | ☐ Not remove |
| W26 | 2.5 | | | 1 CBC | 96.5 | | <7 | ☐ Not remove |
| W27 | 2.5 | | | 10 CBC | 87.5 | | >12 | ☐ Complete remove |
| W28 | 2.5 | | | 1 trisCOH | 96.5 | | 7 <> 12 | ☐ Partial remove |
| W29 | 2.5 | | | 10 trisCOH | 87.5 | | >12 | ☐ Complete remove |
| W30 | 20 | | | 18 | 42 | 20 | >12 | ☐ Complete remove |
| W31 | 2.5 | | | 12.25 trisCOH | 12 | 70 DMSO 3 AEEA 0.25 MDEA | >12 | |

COH = choline hydroxide
CBC = choline bicarbonate
CCl = choline chloride
trisCOH = tris-choline hydroxide
HDA = hydroxylamine
HAS = hydroxylamine sulfate
AEEA = N-(2-aminoethyl)ethanolamine
MDEA = methyldiethanolamine
7 <> 12 = between 7 and 12
☐Not remove
☐Partial remove
☐Complete remove The most effective compositions for removing WLP photoresist were those that exhibited a balance of the amounts of the organic ammonium compound and the oxoammonium compound so as to yield a pH of at least about 12. The compositions with pH between about 7 and about 12 were less complete in their removal of the photoresist at about 55° C. and about 10 minutes contact time, but may have better performance at higher temperatures and/or at longer contact times.

Comparison of Copper Corrosion/Etch Rates

Compositions W20 and W16 were evaluated for their corrosion rate, or etch rate, of copper metal, after removal of DuPont WB3000 dry film photoresists from WLP substrates, as shown below in Table 20.

TABLE 20

Cu Corrosion Rate of W20 (top) vs. W16 (bottom).

| Time (min) | Initial Cu Thickness (Å) | Final Cu Thickness (Å) | Thickness Loss (Å) | Normalized Thickness Remaining (%) | % Thickness Loss |
|---|---|---|---|---|---|
| 5 | 3386.405 | 3336.827 | 49.578 | 98.536 | 1.46 |
| 10 | 3401.504 | 3321.873 | 79.631 | 97.659 | 2.34 |
| 20 | 3380.081 | 3261.127 | 118.954 | 96.481 | 3.52 |
| 30 | 3371.516 | 3189.327 | 182.189 | 94.596 | 5.40 |

TABLE 20-continued

Cu Corrosion Rate of W20 (top) vs. W16 (bottom).

| Time (min) | Initial Cu Thickness (Å) | Final Cu Thickness (Å) | Thickness Loss (Å) | Normalized Thickness Remaining (%) | % Thickness Loss |
|---|---|---|---|---|---|
| 5 | 3349.17 | 3319.02 | 30.15 | 99.10 | 0.90 |
| 10 | 3333.26 | 3272.00 | 61.26 | 98.16 | 1.84 |
| 20 | 3364.01 | 3258.61 | 105.40 | 96.87 | 3.13 |
| 30 | 3359.31 | 3249.55 | 109.76 | 96.73 | 3.27 |

Composition W20, which includes the sugar alcohol sorbitol, exhibited significantly higher copper corrosion than composition W16, upon contact with the wafer-level packaging substrate. The reduced corrosion rate of copper is especially key in wafer-level packaging operations. Although defects/problems with surfaces, such as corrosion, are issues in both damascene-type architecture (e.g., individual chip layer structural fabrication) operations and in later operations (e.g., WLP/PCB applications), the impact of such defects/problems is much more critical in the latter, as more steps have been accomplished to get to the WLP/PCB stage than in particularly the early layers of damascene-type architecture.

With regard to the corrosion/etch rates, it is interesting to note that composition W20 is similar to those compositions disclosed in U.S. Pat. No. No. 5,846,695 to Iwata as being non-corrosive to aluminum metal substrate layers; however, compositions containing sugar alcohols, such as W20 and those in Iwata, exhibit reduced inhibition of corrosion when in contact with copper metal layers, at least as compared to compositions according to the invention, such as W16.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A composition for removing a polymer, etch residue, ash residue, or a combination thereof from a substrate on which a circuit or a portion of a circuit is present, which composition comprises:

an organic ammonium compound having the formula

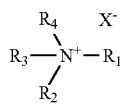

wherein:
X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof,
$R_1$ is an alkyl group or a group derived from the reaction of a tertiary amine with an organic epoxy, and
$R_2$, $R_3$, and $R_4$ are each not hydrogen and are independently alkyl, benzyl, hydroxyalkyl, phenyl, a group derived from the reaction of a tertiary amine with an organic epoxy, or another group contained in a tertiary amine;

more than about 2% by weight of an oxoammonium compound having the formula

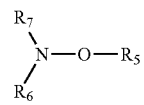

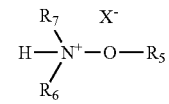

wherein:
X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof,
each $R_5$ is independently hydrogen, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof, and
each $R_6$ and $R_7$ is independently hydrogen, a hydroxyl group, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof;
an organic polar solvent that is miscible with water and water,
wherein the composition is capable of removing the polymer, the etch residue, the ash residue, or the combination thereof from the substrate, while maintaining the operability of the circuit, or portion thereof, associated with the substrate,
wherein the pH of the composition is above about 9, and
wherein the organic ammonium compound is present in an amount from about 1% to about 30% by weight, the water is present in an amount from about 15% to about 94% by weight, the organic polar solvent is present in an amount from about 25% to about 85% by weight, and the oxoammonium compound is present in an amount not more than about 10% by weight.

2. The composition of claim 1, wherein the organic polar solvent comprises N methyl-pyrrolidone, dimethylsulfoxide, diglycolamine, monoethanolamine, propylene glycol, or a mixture thereof.

3. The composition of claim 1, which is substantially free from one or more of chelators, corrosion inhibitors, film-forming agents, surfactants, abrasive particles, alkanolamines, fluoride-containing compounds, oxidizing agents, reducing agents other than the oxoammonium compound, and pH adjusting agents comprising alkali metals, unfunctionalized trialkylammonium compounds, and unfunctionalized tetraalkylammonium compounds.

4. The composition of claim 2, which is substantially free from one or more of chelators, corrosion inhibitors, film-forming agents, surfactants, abrasive particles, alkanolamines, fluoride-containing compounds, oxidizing agents, reducing agents other than the oxoammonium compound, and pH adjusting agents comprising alkali metals, unfunctionalized trialkylammonium compounds, and unfunctionalized tetraalkylammonium compounds.

5. The composition of claim 1, wherein the polymer comprises acrylate repeat units, methacrylate repeat units, or both.

6. The composition of claim 5, wherein the polymer is significantly transparent to deep ultraviolet radiation and wherein said composition chemically interacts with the carboxyl group of said polymer.

7. The composition of claim 1, wherein said composition is compatible with said circuit, said circuit comprising copper and at least one low-K dielectric material.

8. The composition of claim 5, wherein the pH of the composition is above about 12.

9. A composition for removing a polymer proximate to which a circuit, or a portion of a circuit, is disposed, which composition comprises:

an organic ammonium compound having the formula

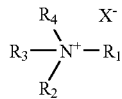

wherein:

X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof, $R_1$ is an alkyl group or a group derived from the reaction of a tertiary amine with an organic epoxy, and $R_2$, $R_3$, and $R_4$ are each not hydrogen and are independently alkyl, benzyl, hydroxyalkyl, phenyl, a group derived from the reaction of a tertiary amine with an organic epoxy, or another group contained in a tertiary amine;

more than about 2% by weight of an oxoammonium compound having the formula

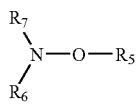

-continued

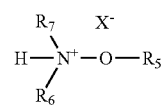

wherein:

X is hydroxide, sulfate, hydrogen sulfate, phosphate, hydrogen phosphate, dihydrogen phosphate, nitrate, a carboxylate, a halide, carbonate, hydrogen carbonate, bifluoride, or a combination thereof, each $R_5$ is independently hydrogen, a substituted $C_1$-$C_5$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof, and each $R_6$ and $R_7$ is independently hydrogen, a hydroxyl group, a substituted $C_1$-$C_6$ straight, branched, or cyclic alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, phenyl group, substituted phenyl group, aryl group, substituted aryl group, or a salt or derivative thereof;

an organic polar solvent that is miscible with water and water, wherein the polymer comprises a carbonyl moiety, a carboxyl moiety, a nitrile moiety, an imide moiety, or a combination thereof; and wherein the composition is capable of removing the polymer by interaction with the carbonyl moiety, the carboxyl moiety, the nitrile moiety, the imide moiety, or the combination thereof, while maintaining the operability of the circuit, or portion thereof, proximate thereto, wherein the pH of the composition is above about 9, and wherein the organic ammonium compound is present in an amount from about 1% to about 30% by weight, the water is present in an amount from about 15% to about 94% by weight, the organic polar solvent is present in an amount from about 25% to about 85% by weight, and the oxoammonium compound is present in an amount not more than about 10% by weight.

* * * * *